US010354932B2

(12) United States Patent
Yunokuchi

(10) Patent No.: US 10,354,932 B2
(45) Date of Patent: Jul. 16, 2019

(54) SEMICONDUCTOR DEVICE INCLUDING SEMICONDUCTOR ELEMENT AND REDISTRIBUTION LAYER ELECTRICALLY CONNECTED THERETO, AND METHOD OF MANUFACTURING THE DEVICE

(71) Applicant: ASAHI KASEI KABUSHIKI KAISHA, Tokyo (JP)

(72) Inventor: Tomoshige Yunokuchi, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/920,863

(22) Filed: Mar. 14, 2018

(65) Prior Publication Data

US 2018/0342432 A1 Nov. 29, 2018

(30) Foreign Application Priority Data

Mar. 22, 2017 (JP) .................................. 2017-056225

(51) Int. Cl.
*H01L 23/29* (2006.01)
*H01L 23/498* (2006.01)
*H01L 23/31* (2006.01)
*H01L 23/00* (2006.01)

(52) U.S. Cl.
CPC ...... *H01L 23/293* (2013.01); *H01L 23/49838* (2013.01); *H01L 23/3128* (2013.01); *H01L 23/562* (2013.01); *H01L 2224/18* (2013.01)

(58) Field of Classification Search
CPC .......................... H01L 23/293; H01L 23/49838
USPC .......................................................... 257/773
See application file for complete search history.

(56) References Cited

U.S. PATENT DOCUMENTS

2017/0114081 A1\* 4/2017 Rekken .................... C07F 7/10
2018/0051136 A1 2/2018 Koyama et al.

FOREIGN PATENT DOCUMENTS

| JP | 2013-15729 A | 1/2013 |
| TW | 201638663 A | 11/2016 |
| TW | 201710390 A | 3/2017 |

\* cited by examiner

*Primary Examiner* — Jami Valentine Miller
(74) *Attorney, Agent, or Firm* — Greenblum & Bernstein, P.L.C.

(57) ABSTRACT

It is an object to particularly improve compositions of interlayer insulation films so as to provide semiconductor devices which exert high elongation percentage, are excellent in adherence and are hard to generate a crack, and methods of manufacturing the devices, and a semiconductor device (1) of the present invention is a semiconductor device provided with a semiconductor element (2) and a redistribution layer (4) electrically connected to the semiconductor element, and is characterized in that a solvent with specific gravity of 0.96 g/cm$^3$ or more at a temperature of 25° C. remains in an amount of 5 ppm or more relative to the entire weight of an interlayer insulation film (6) inside the interlayer insulation film of the redistribution layer. According to the semiconductor device of the present invention, it is possible to exert high elongation percentage, provide excellent adherence, and suppress generation of a crack.

41 Claims, 2 Drawing Sheets

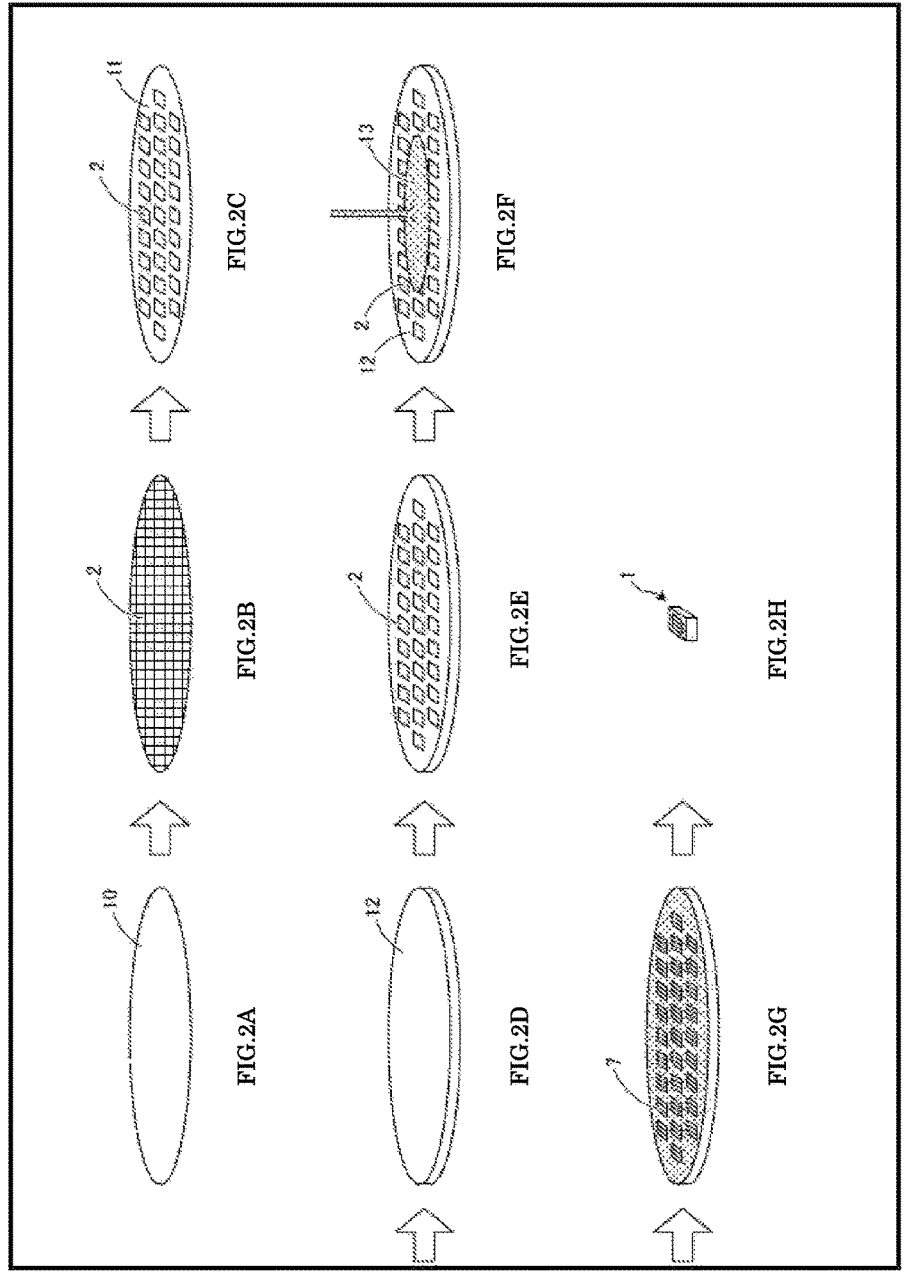

SEMICONDUCTOR DEVICE INCLUDING SEMICONDUCTOR ELEMENT AND REDISTRIBUTION LAYER ELECTRICALLY CONNECTED THERETO, AND METHOD OF MANUFACTURING THE DEVICE

TECHNICAL FIELD

The present invention relates to semiconductor devices and methods of manufacturing the devices.

BACKGROUND ART

There are various methods, as a semiconductor package technique in a semiconductor device. For example, surfaces of a semiconductor element except one surface are covered with a sealing material (mold resin) to form an element sealing material, and further, a redistribution layer is formed on the surface of the semiconductor element which is not covered with the sealing material. Among semiconductor package techniques, a semiconductor package technique called Fan-Out has been the mainstream.

According to the Fan-Out type, a semiconductor element (semiconductor chip) is covered with a sealing material to be a larger region than the chip size, the element sealing body is thereby formed, and further, a redistribution layer is formed to extend to the semiconductor chip and the region of the sealing material. Since the redistribution layer is thin and it is possible to use up to the region of the sealing material as the formation region of the redistribution layer, it is possible to increase the number of external connection terminals.

For example, as conventional techniques, there are known photosensitive resin compositions capable of being used in an interlayer insulation film and the like (Patent Document 1).

PRIOR ART DOCUMENT

Patent Document
[Patent Document 1] Japanese Unexamined Patent Publication No. 2013-15729

DISCLOSURE OF INVENTION

Problems to be Solved by the Invention

In addition, as properties of the interlayer insulation film inside the redistribution layer, important are elongation percentage, adherence to the element sealing material, and further, reliability based on the presence or absence of a crack. These properties are further important, particularly, in the form where the interlayer insulation film is wide and comes into intimate contact with the mold resin, like the Fan-Out type.

However, conventionally, there has been room for improvements in the respects of elongation percentage, adherence and reliability of the interlayer insulation film.

The present invention was made in view of such a respect, and it is an object of the invention to provide semiconductor devices and methods of manufacturing the devices where an interlayer insulation film exerts high elongation percentage, is excellent in adherence, and further, is hard to generate a crack.

Means for Solving the Problem

The present invention is of a semiconductor device which is provided with a semiconductor element and a redistribution layer electrically connected to the semiconductor element, and which is characterized in that a solvent with specific gravity of 0.96 g/cm$^3$ or more at a temperature of 25° C. remains in an amount of 5 ppm or more relative to the entire weight of an interlayer insulation film inside the interlayer insulation film of the redistribution layer in a gas chromatography-mass spectrometry test using cyclopentanone or a gas chromatography-mass spectrometry test using a pyrolyzer.

In the present invention, it is preferable that the solvent with specific gravity of 0.96 g/cm$^3$ or more at a temperature of 25° C. remains in 30 percent by weight or less inside the interlayer insulation film.

In the invention, in a planar view, it is preferable that the redistribution layer is larger than the semiconductor element.

In the invention, it is preferable that the device contains a sealing material to seal the semiconductor element, and that the sealing material contacts the interlayer insulation film.

In the invention, the sealing material preferably contains an epoxy resin.

In the invention, the interlayer insulation film preferably contains a polyimide skeleton.

In the invention, the interlayer insulation film preferably contains a polyimide expressed by the following formula 1.

[Chemistry 1]

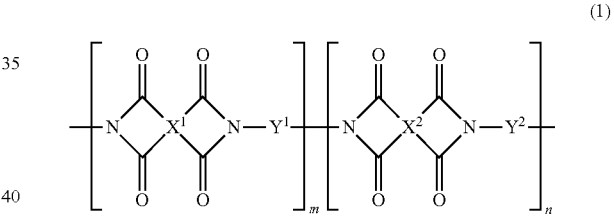

(1)

(In addition, each of X$^1$ and X$^2$ represents a teteravalent organic group, and each of Y$^1$ and Y$^2$ represents a divalent organic group. Further, X$^1$ and X$^2$ may be the same or may be different from each other, and Y$^1$ and Y$^2$ may be the same or may be different from each other. Both of m and n are integers.)

In the invention, it is preferable that at least one of X$^1$ and X$^2$ in the above-mentioned formula (1) contains at least one structure selected from the following formulas (2) to (4).

[Chemistry 2]

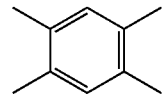

(2)

[Chemistry 3]

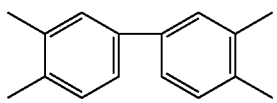

(3)

-continued

[Chemistry 4]

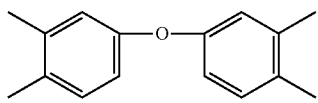
(4)

In the invention, it is preferable that at least one of $X^1$ and $X^2$ in the above-mentioned formula (1) contains the structure of the above-mentioned formula (4).

In the invention, it is preferable that at least one of $Y^1$ and $Y^2$ in the above-mentioned formula (1) contains at least one structure selected from the following formulas (5) to (7).

[Chemistry 5]

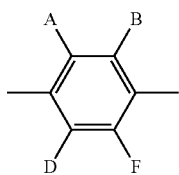
(6)

(A, B, D and E represent hydrogen atoms or monovalent aliphatic groups with the carbon number of from 1 to 4, and may be the same or may be different from one another.)

[Chemistry 6]

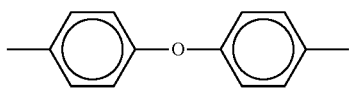
(6)

[Chemistry 7]

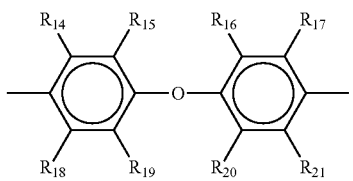
(7)

(In the formula (7), each of $R_{14}$ to $R_{21}$ represents a hydrogen atom, a halogen atom or a monovalent organic group with the carbon number of from 1 to 4, and may be different from one another, or may be the same.)

In the invention, it is preferable that at least one of $Y^1$ and $Y^2$ in the above-mentioned formula (1) contains the structure of the above-mentioned formula (6).

In the invention, it is preferable that the interlayer insulation film contains a first polyimide expressed by the above-mentioned formula (1) and a second polyimide expressed by the above-mentioned formula (1), at least one of $X^1$ and $X^2$ of the first polyimide contains the structure of the above-mentioned formula (3), and that at least one of $X^1$ and $X^2$ of the second polyimide contains the structure of the above-mentioned formula (4).

In the invention, it is preferable that at least one of $Y^1$ and $Y^2$ of the first polyimide contains the structure of the above-mentioned formula (6), and that at least one of $Y^1$ and $Y^2$ of the second polyimide contains the structure of the above-mentioned formula (6).

In the invention, the interlayer insulation film preferably contains a poly(benzoxazole) skeleton.

In the invention, the interlayer insulation film preferably contains a phenole skeleton.

In the invention, the solvent preferably contains at least one solvent selected from γ-butyrolactone, N-methyl-2-pyrrolidone, ethyl lactate, dimethyl sulfoxide, and propylene glycol monomethyl ether acetate (PGMEA).

In the invention, it is preferable that a solvent with specific gravity of 0.96 g/cm$^3$ or more at a temperature of 25° C. remains in a range of 10 ppm to 2000 ppm relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in a range of 20 ppm to 500 ppm relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in a range of 20 ppm to 400 ppm relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in a range of 40 ppm to 300 ppm relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in an amount of 50 ppm or more relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in an amount of 100 ppm or more relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in an amount of 150 ppm or more relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in an amount of 200 ppm or more relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in an amount of 250 ppm or more relative to the entire weight of the interlayer insulation film inside the interlayer insulation film of the redistribution layer.

In the invention, it is preferable that the solvent with specific gravity of 0.96 g/cm$^3$ or more at a temperature of 25° C. remains in an amount of 300 ppm or more relative to the entire weight of the interlayer insulation film inside the interlayer insulation film of the redistribution layer.

A method of manufacturing a semiconductor device in the present invention is a method of manufacturing a semiconductor device including a preparation step of preparing a semiconductor element, and a redistribution layer formation step of forming a redistribution layer connected to the semiconductor element, and is characterized in that the redistribution layer formation step includes a relief pattern formation step of exposing and developing a photosensitive resin composition to form a relief pattern, and an interlayer insulation film formation step of heating the relief pattern to form an interlayer insulation film inside the redistribution layer, the photosensitive resin composition contains a photosensitive resin, a first solvent with specific gravity of 0.96 g/cm$^3$ or more at a temperature of 25° C., and a second solvent with specific gravity of 0.77 g/cm$^3$ or more and less than 0.96 g/cm$^3$ at a temperature of 25° C., and that in the interlayer insulation film formation step, the relief pattern is heated so that the solvent with specific gravity of 0.96 g/cm$^3$ or more at a temperature of 25° C. remains in an amount of 5 ppm or more inside the interlayer insulation film, in a gas chromatography-mass spectrometry test using cyclopentanone or a gas chromatography-mass spectrometry test using a pyrolyzer.

In the invention, in a planar view, it is preferable that the redistribution layer is larger than the semiconductor element.

The invention preferably includes a sealing step of sealing the semiconductor element with a sealing material containing an epoxy resin.

In the invention, in the interlayer insulation film formation step, the relief pattern is preferably heated at a temperature of 190° C. or less.

In the invention, [weight of the first solvent]/[weight of the second solvent] contained in the photosensitive resin composition preferably ranges from 0.01 to 100.

In the invention, the second solvent preferably contains a ketone-based solvent.

In the invention, the second solvent preferably contains 2-octanone.

In the invention, the first solvent preferably contains at least one solvent selected from γ-butyrolactone, N-methyl-2-pyrrolidone, ethyl lactate, dimethyl sulfoxide, and propylene glycol monomethyl ether acetate (PGMEA).

In the invention, the photosensitive resin preferably contains at least one resin selected from a polyimide precursor, a poly(benzoxazole) precursor, and a phenol resin.

In the invention, in the interlayer insulation film formation step, it is preferable that the relief pattern is heated so that the solvent with specific gravity of 0.96 g/cm$^3$ or more at a temperature of 25° C. remains in an amount of 50 ppm or more inside the interlayer insulation film, in the gas chromatography-mass spectrometry test using cyclopentanone or the gas chromatography-mass spectrometry test using a pyrolyzer.

In the invention, in the interlayer insulation film formation step, it is preferable that the relief pattern is heated so that the solvent with specific gravity of 0.96 g/cm$^3$ or more at a temperature of 25° C. remains in an amount of 100 ppm or more inside the interlayer insulation film, in the gas chromatography-mass spectrometry test using cyclopentanone or the gas chromatography-mass spectrometry test using a pyrolyzer.

In the invention, in the interlayer insulation film formation step, it is preferable that the relief pattern is heated so that the solvent with specific gravity of 0.96 g/cm$^3$ or more at a temperature of 25° C. remains in an amount of 150 ppm or more inside the interlayer insulation film, in the gas chromatography-mass spectrometry test using cyclopentanone or the gas chromatography-mass spectrometry test using a pyrolyzer.

In the invention, in the interlayer insulation film formation step, it is preferable that the relief pattern is heated so that the solvent with specific gravity of 0.96 g/cm$^3$ or more at a temperature of 25° C. remains in an amount of 200 ppm or more inside the interlayer insulation film, in the gas chromatography-mass spectrometry test using cyclopentanone or the gas chromatography-mass spectrometry test using a pyrolyzer.

In the invention, in the interlayer insulation film formation step, it is preferable that the relief pattern is heated so that the solvent with specific gravity of 0.96 g/cm$^3$ or more at a temperature of 25° C. remains in an amount of 250 ppm or more inside the interlayer insulation film, in the gas chromatography-mass spectrometry test using cyclopentanone or the gas chromatography-mass spectrometry test using a pyrolyzer.

In the invention, in the interlayer insulation film formation step, it is preferable that the relief pattern is heated so that the solvent with specific gravity of 0.96 g/cm$^3$ or more at a temperature of 25° C. remains in an amount of 300 ppm or more inside the interlayer insulation film, in the gas chromatography-mass spectrometry test using cyclopentanone or the gas chromatography-mass spectrometry test using a pyrolyzer.

Advantageous Effect of the Invention

According to the semiconductor device of the invention, it is possible to exert high elongation percentage, provide excellent adherence, and suppress generation of a crack.

BRIEF DESCRIPTION OF DRAWINGS

FIG. 2 shows one example of steps of manufacturing the semiconductor device of this Embodiment.

BEST MODE FOR CARRYING OUT THE INVENTION

Figure 1:
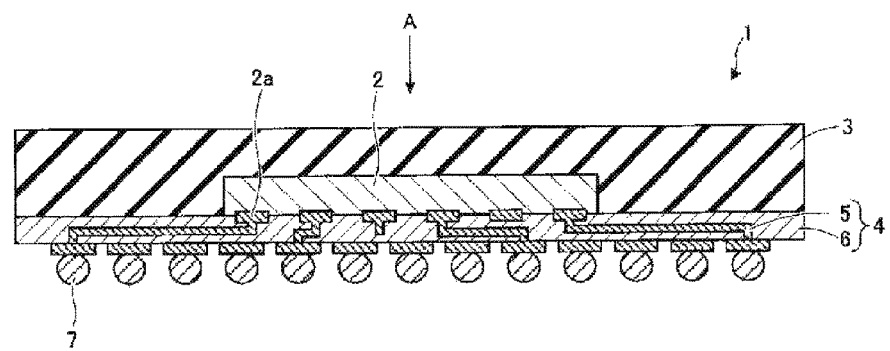
FIG. 1 is a cross-sectional schematic diagram of a semiconductor device of this Embodiment.

One Embodiment (hereinafter, abbreviated as "Embodiment") of semiconductor devices of the present invention will be described below in detail with reference to drawings. In addition, the invention is not limited to the following Embodiment, and is capable of being carried into practice with various modifications thereof within the scope of the subject matter thereof.

(Semiconductor Device)

As shown in FIG. 1, a semiconductor device (semiconductor 1C) 1 has a semiconductor element (semiconductor chip) 2, a sealing material (mold resin) 3 to cover the semiconductor element 2, and a redistribution layer 4 brought into intimate contact with the semiconductor element 2 and sealing material 3 to be comprised thereof.

As shown in FIG. 1, the sealing material 3 is formed to cover the surface of the semiconductor element 2, and in a planar view (arrow A), to be a larger area than a region of the semiconductor element 2.

The redistribution layer 4 has a plurality of wirings 5 electrically connected to a plurality of terminals 2a provided on a circuit surface of the semiconductor element 2, and an interlayer insulation film 6 to fill in between wirings 5 to be comprised thereof. The wiring 5 extends from a position of the terminal 2a to the backside of the redistribution layer 4, and external terminals 7 connected to the wirings 5 are formed on the backside of the redistribution layer 4.

As shown in FIG. 1, in a planar view (arrow A), the redistribution layer 4 is formed to be larger than the semiconductor element 2. The semiconductor device 1 shown in FIG. 1 constitutes the Fan-Out type. In the semiconductor device 1 shown in FIG. 1, an area S1 of the redistribution layer 4 in the planar view (arrow A) is configured to be larger than an area S2 of the semiconductor element 2 in the planar view (arrow A). Although the area S1 of the redistribution layer 4 is not limited particularly, the area S1 of the redistribution layer 4 is preferably 1.05 times or more the area S2 of the semiconductor element 2, preferably 1.1 times or more, and preferably 1.3 times or more.

In the Fan-Out type, the redistribution layer 4 is brought into intimate contact with not only the semiconductor element 2 but also the sealing material 3. The semiconductor device 1 shown in FIG. 1 is one example, and this Embodiment includes a configuration where the sealing material 3 is not provided, or with the sealing material provided, the redistribution layer 4 and sealing material 3 are not brought into intimate contact like wafer level CSP.

(Interlayer Insulation Film)

In addition, the inventor of the present invention noted a residual amount of a solvent in the interlayer insulation film 6, in order to improve elongation percentage of the interlayer insulation film 6, adherence to the semiconductor element 2 and sealing material 3 (adherence to the semiconductor element 2 in the configuration where the layer is not brought into intimate contact with the sealing material 3), and reliability based on the presence or absence of a crack in the interlayer insulation film 6. In other words, the interlayer insulation film 6 of this Embodiment has the following feature points.

In this Embodiment, a solvent with specific gravity of 0.96 g/cm$^3$ or more at a temperature of 25° C. remains in an amount of 5 ppm or more inside the interlayer insulation film 6. In addition, the residual amount (5 ppm-0.0005%) is a value with the entire weight of the interlayer insulation film 6 being 100%.

In this Embodiment, the residual amount of the solvent with specific gravity of 0.96 g/cm$^3$ or more at a temperature of 25° C. contained inside the interlayer insulation film 6 is preferably 6 ppm or more, more preferably 7 ppm or more, further preferably 8 ppm or more, further more preferably 9 ppm or more, further more preferably 10 ppm or more, further more preferably 12 ppm or more, further more preferably 15 ppm or more, further more preferably 20 ppm or more, further more preferably 30 ppm or more, further more preferably 50 ppm or more, further preferably 60 ppm or more, further preferably 70 ppm or more, further preferably 80 ppm or more, further preferably 90 ppm or more, and further more preferably 100 ppm or more. Further, the residual amount may be 120 ppm or more, 150 ppm or more, 180 ppm or more, and 200 ppm or more. Furthermore, the residual amount may be 250 ppm or more, 300 ppm or more, 350 ppm or more, 400 ppm or more, 450 ppm or more, 500 ppm or more, 550 ppm or more, 600 ppm or more, 650 ppm or more, 700 ppm or more, 750 ppm or more, 800 ppm or more, 850 ppm or more, 900 ppm or more, 950 ppm or more, and 1000 ppm or more. Still furthermore, the residual amount may be 1200 ppm or more, 1400 ppm or more, 1600 ppm or more, 1800 ppm or more, 2000 ppm or more, 2200 ppm or more, 2400 ppm or more, 2600 ppm or more, 2800 ppm or more, and 3000 ppm or more. Moreover, the residual amount may be 3500 ppm or more, 4000 ppm or more, 4500 ppm or more, 5000 ppm or more, 5500 ppm or more, and 6000 ppm or more. Further, the residual amount may be 7000 ppm or more, 8000 ppm or more, 9000 ppm or more, and 10000 ppm or more.

Further, an upper limit value of the residual amount of the solvent with specific gravity of 0.96 g/cm$^3$ or more at a temperature of 25° C. contained inside the interlayer insulation film 6 is not limited particular, and for example, it is possible to make 30 percent by weight or less, it is further possible to make 20 percent by weight or less, it is possible to make 10 percent by weight or less, or it is possible to make 5 percent by weight or less. Further, the residual amount may be 3 percent by weight or less, and 1 percent by weight or less. Further, the residual amount may be 9000 ppm or less, 8000 ppm or less, 7000 ppm or less, 6000 ppm or less, 5000 ppm or less, 4000 ppm or less, 3000 ppm or less, 2000 ppm or less, and 1000 ppm or less. Furthermore, the residual amount may be 900 ppm or less, 800 ppm or less, 700 ppm or less, 600 ppm or less, and 500 ppm or less. Still furthermore, the residual amount may be 450 ppm or less, 400 ppm or less, 350 ppm or less, and 300 ppm or less. Moreover, the residual amount may be 280 ppm or less, 260 ppm or less, 240 ppm or less, 220 ppm or less, 200 ppm or less, 180 ppm or less, 160 ppm or less, 140 ppm or less, 120 ppm or less, and 100 ppm or less. Further, the residual amount may be 90 ppm or less, 80 ppm or less, 70 ppm or less, 60 ppm or less, 50 ppm or less, 40 ppm or less, 30 ppm or less, 20 ppm or less, and 10 ppm or less.

The residual amount of the solvent with specific gravity of 0.96 g/cm$^3$ or more at a temperature of 25° C. contained inside the interlayer insulation film 6 particularly preferably ranges from 50 ppm to 800 ppm, and particularly preferably ranges from 75 ppm to 500 ppm.

Thus, by setting the residual amount of the solvent with specific gravity of 0.96 g/cm$^3$ or more at a temperature of 25° C. contained inside the interlayer insulation film 6 at 5 ppm or more, it is possible to obtain the semiconductor device 1 which is capable of exerting high elongation percentage, is excellent in adherence, further hard to generate a crack, and is excellent in reliability.

With respect to the elongation percentage, on conditions of tensile elongation percentage measurement described later, it is possible to make 40% or more, preferably 45% or more, more preferably 50% or more, further preferably 55% or more, and further more preferably 60% or more.

Further, in the adherence, as shown in experiments described later, with respect to adherence between the interlayer insulation film 6 and epoxy resin, it is possible to make 50 kg/mm$^2$ or more, preferably 55 kg/mm$^2$ or more, more preferably 60 kg/mm$^2$ or more, further preferably 65 kg/mm$^2$ or more, and further more preferably 70 kg/mm$^2$ or more.

Furthermore, with respect to the reliability (the presence or absence of a crack), in a crack test described later, it is preferable that any crack does not exist, and that peeling does not occur.

As shown in FIG. 1, in the configuration where the redistribution layer 4 and the sealing material 3 are brought into intimate contact with each other, since high adherence is obtained to the sealing material 3, it is possible to particularly preferably apply to the interlayer insulation film 6 used in the Fan-Out type.

The solvent with specific gravity of 0.96 g/cm$^3$ or more at a temperature of 25° C. preferably contains at least one solvent selected from γ-butyrolactone, N-methyl-2-pyrrolidone, ethyl lactate, dimethyl sulfoxide, and propylene glycol monomethyl ether acetate (PGMEA). Particularly, it is preferable that γ-butyrolactone is selected.

In this Embodiment, a resin constituting the interlayer insulation film 6 is not limited particularly, as long as the resin has photosensitivity, and for example, the resin is preferably a resin which contains at least one skeleton selected from a polyimide skeleton, a poly(benzoxazole) skeleton, and a phenole skeleton.

Further, in this Embodiment, the device includes the sealing material 3 to seal the semiconductor element 2, and the sealing material 3 is preferably brought into contact with the interlayer insulation film. Furthermore, the sealing material 3 preferably contains an epoxy resin. In this Embodiment, it is possible to obtain good adherence between the interlayer insulation film 6 and the sealing material (epoxy resin) 3.

(Method of Manufacturing the Semiconductor Device)

The method of manufacturing the semiconductor device in this Embodiment will be described using FIG. 2. In FIG. 2A, pre-process processed wafer 10 is prepared. Then, in FIG. 2B, the pre-process processed wafer 10 is subjected to dicing to from a plurality of semiconductor elements (semiconductor chips) 2. The semiconductor element 2 may be a purchase. As shown in FIG. 2C, thus prepared semiconductor elements 2 are bonded onto a support body 11 at predetermined intervals.

Next, a mold resin 12 is applied to above the semiconductor element 2 and above the support body 11, and as shown in FIG. 2D, mold sealing is performed. Next, the support body 11 is peeled off, and the mold resin 12 is reversed (see FIG. 2E). As shown in FIG. 2E, the semiconductor element 2 and mold resin 12 appear approximately in the same plane. Next, in a step shown in FIG. 2F, a photosensitive resin composition 13 is applied onto the semiconductor element 2 and mold resin 12. Then, the applied photosensitive resin composition 13 is exposed and developed to form a relief pattern (relief pattern formation step). In addition, the photosensitive resin composition 13 may be the positive type or may be the negative type. Further, the relief pattern is heated to form a cured relief pattern (interlayer insulation film formation step). According to this Embodiment, as shown in experiments described later, it is possible to obtain the cured relief pattern, by heating at 190° C. or less, preferably 180° C. or less, and more preferably 170° C. or less and adjusting time. The cured relief pattern is the interlayer insulation film 6 of the semiconductor element 2. As long as the temperature to heat the relief pattern is 190° C. or less, the temperature is not limited particularly, and may be 100° C. or more, 130° C. or more, 150° C. or more, or 160° C. or more. Further, the heating time is not limited particularly, as long as the time is time of the extent to which a solvent with specific gravity of 0.96 g/cm$^3$ or more at a temperature of 25° C. remains in an amount of 5 ppm or more relative to the entire weight of the interlayer insulation film inside the interlayer insulation film of the redistribution layer. By lowering the temperature to heat the relief pattern and shortening the heating time, it is possible to increase an amount of the solvent with specific gravity of 0.96 g/cm$^3$ or more at a temperature of 25° C. contained inside the cured relief pattern (interlayer insulation film 6).

In addition, in this Embodiment, the relief pattern formation step and interlayer insulation film formation step are combined to be a redistribution layer formation step of forming the redistribution layer connected to the semiconductor element 2.

Then, in FIG. 2G, a plurality of external connection terminals 7 that correspond to respective semiconductor elements 2 is formed (bump formation), portions between semiconductor elements 2 are subjected to dicing, and as shown in FIG. 2H, it is thereby possible to obtain the semiconductor device (semiconductor IC). In this Embodiment, by the manufacturing method shown in FIG. 2, it is possible to obtain a plurality of Fan-Out type semiconductor devices 1.

According to the method of manufacturing the semiconductor device of this Embodiment, in a planar view, it is possible to form the redistribution layer to be larger than the semiconductor element 2. Further, it is preferable to include a sealing step (step of FIG. 2D) of sealing the semiconductor element 2 with the sealing material (mold resin 12) containing an epoxy resin. By this means, it is possible to suitably seal the semiconductor element 2. Further, on the redistribution layer (interlayer insulation film 6) larger than the size of the semiconductor element 2, by forming the sealing material in contact therewith, it is possible to more enhance the sealing property.

In this Embodiment, the photosensitive resin composition 13 applied in the step of FIG. 2F contains a photosensitive resin, a first solvent with specific gravity of 0.96 g/cm$^3$ or more at a temperature of 25° C., and a second solvent with specific gravity of 0.77 g/cm$^3$ or more and less than 0.96 g/cm$^3$ at a temperature of 25° C.

Thus, the photosensitive resin composition 13 contains the first solvent with specific gravity of 0.96 g/cm$^3$ or more at a temperature of 25° C., and the second solvent with specific gravity of 0.77 g/cm$^3$ or more and less than 0.96 g/cm$^3$ at a temperature of 25° C., the heating temperature of the relief pattern is set at 190° C. or less, it is thereby possible to leave the first solvent with high specific gravity after the heating step, and according to this Embodiment, it is possible to cause the solvent with specific gravity of 0.96 g/cm$^3$ or more at a temperature of 25° C. to remain in an amount of 5 ppm or more inside the interlayer insulation film 6 of the semiconductor device 1.

At this point, [weight of the first solvent]/[weight of the second solvent] contained in the photosensitive resin composition 13 preferably ranges from 0.01 to 100. Further, in this Embodiment, [weight of the first solvent]/[weight of the second solvent] preferably ranges from 0.02 to 50, more preferably ranges from 0.04 to 25, and further preferably ranges from 0.05 to 20.

Further, as the second solvent, it is preferable to contain a ketone-based solvent. Examples of the ketone-based solvent are acetone (specific gravity 0.7888), methyl ethyl ketone (specific gravity 0.8047), methyl isobutyl ketone (specific gravity 0.801), diisobutyl ketone (specific gravity 0.804), cyclohexanone (specific gravity 0.947), cyclopentanone (specific gravity 0.951), 4-hydroxy-4-methyl-2-pentanone (specific gravity 0.9306), isophorone (specific gravity 0.92), 2-octanone (specific gravity 0.819), 2-nonanone (specific gravity 0.82), 3,5,5-trimethylcyclohexanone (specific gravity 0.887) and diacetone alcohol (specific gravity 0.938). Among the solvents, since it is possible to obtain properties of higher elongation percentage in the semiconductor device 1, it is suitable that the second solvent contains 2-octanone.

Further, as the first solvent, it is preferable to contain at least one solvent selected from γ-butyrolactone (specific gravity 1.13), N-methyl-2-pyrrolidone (specific gravity 1.028), ethyl lactate (specific gravity 1.03), dimethyl sulfoxide (specific gravity 1.1), and propylene glycol monomethyl ether acetate (PGMEA) (specific gravity 0.97).

The photosensitive resin contained in the photosensitive resin composition 13 preferably contains at least one resin selected from a polyimide precursor, a poly(benzoxazole) precursor, and a phenol resin.

As described above, when the cured film (interlayer insulation film) is formed, using two kinds of solvents of the first solvent with specific gravity of 0.96 g/cm$^3$ or more at a temperature of 25° C., and the second solvent with specific gravity of 0.77 g/cm$^3$ or more and less than 0.96 g/cm$^3$ at a temperature of 25° C. as solvents of the photosensitive resin composition, it is possible to leave the first solvent in an amount of 5 ppm or more inside the cured film.

The composition of the photosensitive resin composition 13 will specifically be described below. In addition, the composition described below is one example, and any limitations are not added, as long as it is possible to compose resins with photosensitivity.

<Photosensitive Polyamic Acid Ester Composition>
(A) Polyimide Precursor (Photosensitive Resin)

As polyimide precursors, there are polyamide, polyamic acid ester, and the like. For example, as the polyamic acid ester, it is possible to use a polyamic acid ester comprised of only repetition units expressed by the following formula (8).

[Chemistry 8]

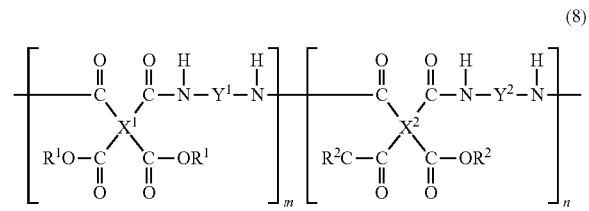

(8)

(Each of $R^1$ and $R^2$ represents a monovalent group with an olefinity double bond, and $R^1$ and $R^2$ may be the same or may be different from each other. Each of $X^1$ and $X^2$ represents a teteravalent organic group, and each of $Y^1$ and $Y^2$ is not limited particularly, as long as the compound is a divalent organic group. Further, $X^1$ and $X^2$ may be the same or may be different from each other. Furthermore, $Y^1$ and $Y^2$ may be the same or may be different from each other.)

Further, two kinds or more of polyamic acid esters expressed by the formula (8) may be mixed and used.

As $X^1$ and $X^2$, for example, from the viewpoint of adherence, the compounds are tetravalent aromatic groups expressed by the following formulas (2) to (4), and may be used alone, or two kinds may be mixed and used.

From the viewpoint of elongation percentage and adherence of the interlayer insulation film, it is preferable that $X^1$ and $X^2$ contain tetravalent aromatic groups expressed by the following formula (3) or (4).

[Chemistry 9]

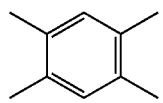

(2)

[Chemistry 10]

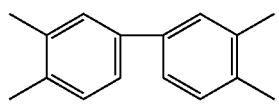

(3)

[Chemistry 11]

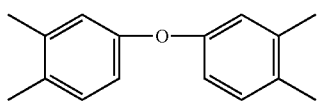

(4)

As $Y^1$ and $Y^2$, for example, from the viewpoint of adherence, the compounds are divalent aromatic groups expressed by the following formulas (5) to (7), and may be used alone, or two kinds may be mixed and used.

From the viewpoint of elongation percentage and adherence, it is preferable that $Y^1$ and $Y^2$ contain tetravalent aromatic groups expressed by the following formula (6).

[Chemistry 12]

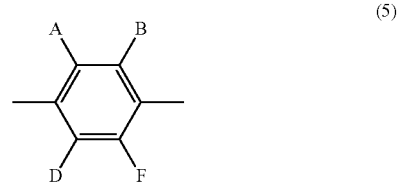

(5)

(A, B, D and E represent hydrogen atoms or monovalent aliphatic groups with the carbon number of from 1 to 4, and may be the same or may be different from one another.)

[Chemistry 13]

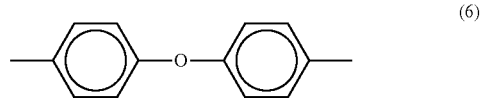

(6)

[Chemistry 14]

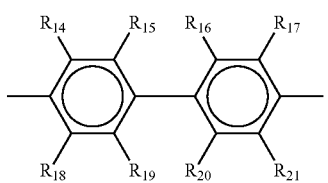

(7)

(In the formula (7), each of $R_{14}$ to $R_{21}$ represents a hydrogen atom, a halogen atom or a monovalent organic group with the carbon number of from 1 to 4, and may be different from one another, or may be the same.)

Particularly, from the viewpoint of adherence, preferable are mixtures of polyamic acid ester using a tetravalent aromatic group expressed by the formula (3) in $X^1$ and $X^2$, and polyamic acid ester using a tetravalent aromatic group expressed by the formula (4) in $X^1$ and $X^2$ or polyamic acid ester using a tetravalent aromatic group expressed by the formula (3) in $X^1$ and a tetravalent aromatic group expressed by the formula (4) in $X^2$. From the viewpoint of adherence, further, $Y^1$ and $Y^2$ preferably contain a tetravalent aromatic group expressed by the formula (6).

In the above-mentioned polyamic acid ester, $Y^1$ and $Y^2$ groups in the repetition unit thereof are derived from an aromatic diamine used as raw materials. Examples of the aromatic diamine are 1,4-phenylenediamine, 2-methyl-1,4-phenylenediamine, 2,5-dimethyl-1,4-phenylenediamine, 2,3,5-trimethyl-1,4-phenylenediamine, 2,3,4,5-tetramethyl-1,4-phenylenediamine and the like. Among preferable examples are 1,4-phenylenediamine, 2,5-dimethyl-1,4-phenylenediamine and the like, These diamines may be used alone, or two or more kinds may be mixed and used. In synthesis of polyamic acid ester (A), generally, such a method is preferably used that tetracarboxylic acid diester obtained by performing an esterification reaction of tetracarboxylic dianhydride, described later, is subjected to a condensation reaction with diamine without modification.

Alcohols used in the above-mentioned esterification reaction of tetracarboxylic dianhydride are alcohols having olefinity double bonds. Among specific alcohols are 2-methacryloyl oxyethyl alcohol, 2-acryloyl oxyethyl alcohol, 1-(acryloyl)oxy-2-propyl alcohol, 2-methacrylamide ethyl alcohol, 2-acrylamide ethyl alcohol, methylol vinyl ketone, 2-hydroxyethyl vinyl ketone, 2-hydroxyethyl methacrylate, 2-hydroxypropyl acrylate, 2-hydroxypropyl methacrylate, 2-hydroxybutyl acrylate, 2-hydroxybutyl methacrylate, 2-hydroxy-3-methoxypropyl acrylate, 2-hydroxy-3-methoxypropyl methacrylate, 2-hydroxy-3-butoxypropyl acrylate, 2-hydroxy-3-butoxypropyl methacrylate, 2-hydroxy-3-phenoxypropyl acrylate, 2-hydroxy-3-phenoxypropyl methacrylate, 2-hydroxy-3-t-butoxypropyl acrylate, 2-hydroxy-3-t-butoxypropyl methacrylate, 2-hydroxy-3-cyclohexyl alkoxy propyl acrylate, 2-hydroxy-3-cyclohexyloxy propyl methacrylate, 2-hydroxy-3-cyclohexyloxy propyl acrylate, 2-(methacryloxy)ethyl-2-hydroxypropyl phthalate, 2-(acryloxy)ethyl-2-hydroxypropyl phthalate, glycerin diacrylate, glycerin dimethacrylate and the like, but the alcohols are not limited thereto. These alcohols are capable of being used alone, or two or more alcohols are capable of being mixed and used.

Further, as described in Japanese Unexamined Patent Publication No. H6-80766, it is also possible to partially mix methyl alcohol, ethyl alcohol, n-propyl alcohol, isopropyl alcohol, allyl alcohol and the like to the above-mentioned alcohol having olefinity double bonds to use.

Theoretically, an amount of alcohols used in the esterification reaction of tetracarboxylic dianhydride is 1.0 equivalent relative to 1.0 equivalent of tetracarboxylic dianhydride (e.g., which refers to that 2 moles of alcohol is added to 1 mole of tetracarboxylic dianhydride). In this Embodiment, when tetracarboxylic diester is synthesized using 1.01 to 1.10 equivalent of alcohol relative to 1.0 equivalent of tetracarboxylic dianhydride, since storage stability is improved in finally obtained photosensitive polyamic acid ester composition, such synthesis is preferable.

A molar ratio of tetracarboxylic diester and diamine used in synthesis of polyamic acid ester (A) is preferably near 1.0:1.0, and it is possible to use in a range of 1:0.7 to 1:1.3, corresponding to the molecular weight of target polyamic acid ester (A).

As a specific method of synthesizing the polyamic acid ester (A) used in this Embodiment, it is possible to adopt conventional publicly known methods. Examples of the methods are a method where tetracarboxylic diester is once converted into tetracarboxylic diester diacid chloride, the tetracarboxylic diester diacid chloride and diamine are subjected to a condensation reaction in the presence of a basic compound, and the polyamic acid ester (A) is thereby manufactured, and another method where tetracarboxylic diester and diamine are subjected to a condensation reaction in the presence of an organic dehydrating agent, and the polyamic acid ester (A) is thereby manufactured, shown in International Publication No. 00/43439 pamphlet.

Examples of the organic dehydrating agent are dicyclohexyl carbodiimide (DCC), diethyl carbodiimide, diisopylcarbodiimide, ethyl-cyclohexylcarbodiimide, diphenyl carbodiimide, 1-ethyl-3-(3-dimethylaminopropyl) carbodiimide, 1-cyclohexyl-3-(3-dimethylaminopropyl) carbodiimide hydrochloride and the like.

In this Embodiment, m/(m+n) of polyamic acid ester expressed by the above-mentioned formula (1) is preferably in a range of 0.3 to 0.9, and preferably in a range of 0.4 to 0.8. When m/(m+n) is 0.3 or more, chemical resistance is improved, and when m/(m+n) is 0.9 or less, resolution performance of the relief pattern is improved.

Further, when $X^1$ and $X^2$ are different tetravalent organic groups, it is possible to prepare polyamic acid ester having both properties of $X^1$ and $X^2$.

Furthermore, when $Y^1$ and $Y^2$ are different divalent organic groups, it is possible to prepare polyamic acid ester having both properties of $Y^1$ and $Y^2$.

A weight average molecular weight of the polyamic acid ester (A) used in this Embodiment preferably ranges from 8000 to 150000, and more preferably ranges from 9000 to 50000. When the weight average molecular weight is 8000 or more, mechanical physical properties are improved. When the weight average molecular weight is 150000 or less, dispersion properties to a developing solution are improved, and resolution performance of the relief pattern is improved.

(B) Photoinitiator

As a photoinitiator, for example, used are benzophenone derivatives such as benzophenone, o-benzoyl methyl benzoate, 4-benzoyl-4'-methyl diphenyl ketone, dibenzyl ketone and fluorenone, acetophenone derivatives such as 2,2'-diethoxyacetophenone and 2-hydroxy-2-methylpropiophenone, thioxanthone derivatives such as 1-hydroxycyclohexyl phenyl ketone, thioxanthone, 2-methyl thioxanthone, 2-isopropyl thioxanthone and diethyl thioxanthone, benzyl derivatives such as benzyl, benzyl dimethyl ketal and benzyl-β-methoxyethyl acetal, benzoin derivatives such as benzoin methyl ether, azides such as 2,6-di(4'-diazidobenzal)-4-methylcyclohexane and 2,6'-di(4'-diazidobenzal) cyclohexane, oximes such as 1-phenyl-1,2-butanedione-2-(O-methoxycarbonyl)oxime, 1-phenylpropanedione-2-(O-methoxycarbonyl)oxime, 1-phenylpropanedione-2-(O-ethoxycarbonyl)oxime, 1-phenylpropanedione-2-(O-benzoyl)oxime, 1,3-diphenylpropanetrione-2-(O-ethoxycarbonyl)oxime and 1-phenyl-3-ethoxypropanetrione-2-(O-benzoyl)oxime, N-aryl glycines such as N-phenyl glycine, peroxides such as benzoyl peroxide, aromatic biimidazoles, and titanocenes, and in terms of curing properties and photosensitivity in a thick film, the oximes are preferable.

An additive amount of these photoinitiators is preferably 1 to 40 parts by mass, and more preferably 2 to 20 parts by mass, relative to 100 parts by mass of polyamic acid ester (A). By adding one part by mass or more of the photoinitiator relative to 100 parts by mass of polyamic acid ester (A), photosensitivity is excellent, and by adding 40 parts by mass or more, thick-film curing properties are excellent.

(C) Solvent

As described above, contained as the solvent are the first solvent with specific gravity of 0.96 g/cm$^3$ or more at a temperature of 25° C., and the second solvent with specific gravity of 0.77 g/cm$^3$ or more and less than 0.96 g/cm$^3$ at a temperature of 25° C. In addition, as well as the above-mentioned solvents, among N-ethyl-2-pyrrolidone, N,N-dimethylacetamide, diethylene glycol dimethyl ether, cyclopentane, α-acetyl-γ-butyrolactone, tetramethylurea, 1,3-dimethyl-2-imidazolidinone, N-cyclohexyl-2-pyrrolidone and the like, one or more solvents may be added.

It is possible to use these solvents in a range of 30 to 1500 parts by mass relative to 100 parts by mass of polyamic acid ester (A), corresponding to a coating film thickness, viscosity and the like.

Further, in order to improve storage stability of the photosensitive polyamic acid ester compound, it is preferable to contain alcohols in organic solvents used as the solvent.

As usable alcohols, as long as alcohols have an alcoholic hydrogen group inside the molecule, and do not have any olefinity double bond, the alcohols are not limited particularly. Specific examples thereof are lactates such as methyl alcohol, ethyl alcohol, n-propyl alcohol, isopropyl alcohol, n-butyl alcohol, isobutyl alcohol, tert-butyl alcohol and ethyl lactate, propylene glycol monoalkyl ethers such as propylene glycol-1-methyl ether, propylene glycol-2-methyl ether, propylene glycol-1-ethyl ether, propylene glycol-2-ethyl ether, propylene glycol-1-(n-propyl) ether and propylene glycol-2-(n-propyl) ether, monoalcohols such as ethylene glycol methyl ether, ethylene glycol ethyl ether and ethylene glycol-n-propyl ether, and dialcohols such as 2-hydroxyisobutyrates, ethylene glycol and propylene glycol. Among the alcohols, preferable are lactates, propylene glycol monoalkyl ethers, 2-hydroxyisobutyrates and ethyl alcohol, and particularly, ethyl lactate, propylene glycol-1-methyl ether, propylene glycol-1-ethyl ether, and propylene glycol-1-(n-propyl) ether are more preferable.

The content of alcohol that does not have any olefinity double bond occupied in the entire solvent is preferably 5 to 50 percent by weight, and more preferably 10 to 30 percent by weight. When the content of alcohol that does not have any olefinity double bond is 5 percent by weight or more, storage stability is good in the photosensitive polyamic acid ester compound. Further, when the content is 50 percent by weight or less, solubility of the polyamic acid ester (A) is good.

(D) Polyamic Acid Ester

As well as the polyamic acid ester (A) comprised of only repetition units expressed by the above-mentioned formula (8) which are the main ingredient, when necessary, in order to improve storage stability of the composition and resolution properties of the relief pattern, within the scope of not impairing heat resistance and chemical resistance, polyamic acid ester (D) expressed by the following formula (9) may be added optionally.

[Chemistry 15]

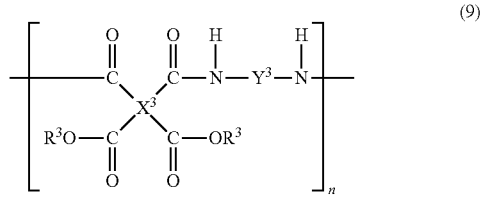

(9)

$R^3$ represents a monovalent group having an olefinity double bond. $X^3$ represents a tetravalent aromatic group expressed by the following formula (4).

[Chemistry 16]

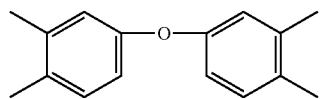

(4)

$Y^3$ represents a divalent aromatic group expressed by the following formula (10).

[Chemistry 17]

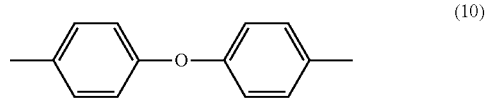

(10)

As an additive amount of polyamic acid ester (D), relative to 100 parts by mass of polyamic acid ester (A), it is preferable to add 150 parts by mass or less, and it is more preferable to add 20 to 100 parts by mass. When the amount is 150 parts by mass or less, heat resistance and chemical resistance is not impaired.

[E] (Crosslinking Agent)

As a crosslinking agent, in heating and curing the relief pattern, it is possible to add a crosslinking agent capable of crosslinking the polyamic acid ester comprised of only repetition units expressed by the above-mentioned formula (8) which are the main ingredient or a crosslinking agent capable of forming a crosslinking network to further enhance heat resistance and chemical resistance. As such an agent, amino resins or derivatives thereof are suitably used, and among the resins and derivatives, suitably used are urea resins, glycol urea resins, hydroxy ethylene urea resins, melamine resins, benzoguanamine resins and derivatives thereof. Alkoxy methylated melamine compounds are particularly preferable, and as an example, there is hexamethoxy methyl melamine. In balance with other performance except heat resistance and chemical resistance, relative to 100 parts by mass of polyamic acid ester (A), the additive amount thereof is preferably 2 to 40 parts by mass, and more preferably 5 to 30 parts by mass. When the additive amount is 2 parts by mass or more, desired heat resistance and chemical resistance is developed, and when the amount is 40 parts by mass or less, storage stability is excellent.

(F) Other Ingredients

In order to improve photosensitivity, it is possible to add a sensitizer optionally. As the sensitizer to improve photosensitivity, examples thereof are Michler's ketone, 4,4'-bis(diethylamino)benzophenone, 2,5-bis(4'-diethylaminobenzal)cyclopentane, 2,6-bis(4'-diethylaminobenzal) cyclohexanone, 2,6-bis(4'-diethylaminobenzal)-4-methyl cyclohexanone, 4,4'-bis(dimethylamino)chalcone, 4,4'-bis(diethylamino)chalcone, p-dimethylamino cinnamylidene indanone, p-dimethylamino benzylidene indanone, 2-(p-dimethylaminophenylbiphenylene)-benzothiazole, 2-(p-dimethylaminophenylvinylene)-benzothiazole, 2-(p-dimethylaminophenylvinylene)-isonaphthothiazole, 1,3-bis(4'-dimethylaminobenzal)acetone, 1,3-bis(4'-diethylaminobenzal)acetone, 3,3-carbonyl-bis(7-diethylaminocoumalin), 3-acetyl-7-dimethylaminocoumalin, 3-ethoxycarbonyl-7-dimethylaminocoumalin, 3-benzyloxycarbonyl-7-dimethylaminocoumalin, 3-methoxycarbonyl-7-diethylaminocoumalin, 3-ethoxycarbonyl-7-diethylaminocoumalin, N-phenyl-N'-ethylethanolamine, N-phenyldiethanolamine, N-p-tolyldiethanolamine, N-phenylethanolamine, 4-morpholino benzophenone, dimethylaminoisoamyl benzoate, diethylaminoisoamyl benzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-d)thiazole, 2-(p-dimethylaminobenzoyl)styrene, benzotriazole, 5-methylbenzotriazole, 5-phenyltetrezole and the like. Among the sensitizers, in terms of photosensitivity, it is preferable to combine a compound having a mercapto group and a compound having a dialkylamino phenyl group to use. It is possible to use these sensitizers alone, or use in combination of 2 to 5 kinds.

It is preferable to use 0.1 to 25 parts by mass of the sensitizer to improve photosensitivity relative to 100 parts by mass of polyamic acid ester (A).

In order to improve resolution properties of the relief pattern, it is possible to add a monomer having photopolymerizable unsaturated bonds. As such a monomer, preferable are meth(acrylate) compounds that cause radical polymerization reaction by a photopolymerization initiator, and although the monomers are not particularly limited to the following compounds, among the compounds are mono or diacrylate and methacrylate of ethylene glycol or polyethylene glycol such as diethylene glycol and tetraethylene glycol dimethacrylate, mono or diacrylate and methacrylate of propylene glycol or polypropylene glycol, mono, di or triacrylate and methacrylate of glycerol, cyclohexane diacrylate and dimethacrylate, diacrylate and dimethacrylate of 1,4-butanediol, diacrylate and dimethacrylate of 1,6-hexanediol, diacrylate and dimethacrylate of neopentyl glycol, mono or diacrylate and methacrylate of bisphenol A, benzene trimethacrylate, isobornyl acrylate and methacrylate, acrylamide and derivatives thereof, methacrylamide and derivatives thereof, trimethylolpropane triacrylate and methacrylate, di or triacrylate and methacrylate of glycerol, di, tri or tetraaclylate and methacrylate of pentaerythritol, ethylene oxide or propylene oxide adducts of these compounds, and the like.

As the monomer having photopolymerizable unsaturated bonds to improve resolution properties of the relief pattern, it is preferable to use the monomer in a range of 1 to 50 parts by mass relative to 100 parts by mass of polyamic acid ester (A).

Further, it is possible to add an adhesive assistant to improve adhesion with a substrate optionally. Among adhesive assistants are silane coupling agents such as γ-aminopropyl dimethoxy silane, N-(β-aminoethyl)-γ-aminopropylmethyl dimethoxysilane, γ-glycidoxypropylmethyl dimethoxysilane, γ-mercaptopropylmethyl dimethoxysilane, 3-methacryloxypropyl dimethoxymethylsilane, 3-methacryloxypropyl trimethoxysilane, diethoxy methyl-3-piperidino propyl silane, diethoxy-3-glycidoxypropylmethyl silane, N-(3-diethoxymethylsilylpropyl)succinimide, N-[3-(triethoxysilyl)propyl] phthalamic acid, benzophenone-3,3'-bis (N-[3-(triethoxysilyl]propylamide)-4,4'-dicarboxylic acid, benzene-1,4-bis(N-[3-triethoxysilyl]propylamide)-2,5-dicarboxylic acid, 3-(triethoxysilyl]propyl succinic anhydride, and N-phenylaminopropyl trimethoxysilane, aluminum-based adhesive assistants such as tris(ethylacetoacetate) aluminium, tris(acetylacetato)aluminium, ethylacetoacetato aluminium diisopropylate, and the like.

Among the assistants, in terms of adhesion strength, it is more preferable to use the silane coupling agent. An additive amount of the adhesive assistant is preferably in a range of 0.5 to 25 parts by mass relative to 100 parts by mass of polyamic acid ester (A).

Further, in order to improve the viscosity of the composition solution in storage and stability of photosensitivity, it is possible to add a thermopolymerization inhibitor to the photosensitive polyamic acid ester composition. As the thermopolymerization inhibitor, used are hydroquinone, N-nitrosodiphenyl amine, p-tert-butylcatechol, phenothiazine, N-phenyl naphthylamine, ethylenediaminetetraacetic acid, 1,2-cyclohexanediaminetetraacetic acid, glycoletherdiaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt, N-nitroso-N(1-naphthyl)hydroxylamine ammonium salt and the like.

As an amount of the thermopolymerization inhibitor to add to the photosensitive polyamic acid ester composition, the amount is preferable in a range of 0.005 to 12 parts by mass relative to 100 parts by mass of polyamic acid ester (A).

In the photosensitive polyamic acid ester composition, as an ingredient to improve heat resistance and chemical resistance, it is possible to use an organic titanium compound optionally. As usable organic titanium compounds, as long as an organic chemical substance is bounded to a titanium atom via a covalent bond or ion bond, the compounds are not limited particularly.

Since there is a case where a good pattern is hard to obtain due to interference with a photoinitiator, among organic titanium compounds, organic titanium compounds that do not function as a photoinitiator are more preferable.

A specific example of the organic titanium compounds is pentamethylcyclopentadienyl titanium trimethoxide and the like.

Further, as an example of the organic titanium compounds, there are titanium chelates. Among the chelates, compounds having two or more alkoxy groups are capable of stability of the composition and good pattern, and thereby preferable, and specific preferable examples are titanium bis(triethanol amine)diisopropoxide, titanium(n-butoxide) (bis-2,4-pentanedionate), titanium diisopropoxide (bis-2,4-pentanedionate), titanium diisopropoxide bis(tetramethylheptanedionate), titanium diisopropoxide bis(ethylacetoacetate) and the like.

Further, it is possible to also use tetraalkoxides such as titanium tetra(n-butoxide), titanium tetraethoxide, titanium tetra(2-ethylhexoxide), titanium tetraisobutoxide, titanium tetraisopropoxide, titanium tetramethoxide, titanium tetramethoxy propoxide, titanium tetramethyl phenoxide, titanium tetra(n-nonyloxide), titanium tetra(n-propoxide), titanium tetrastearoxide, titanium tetrakis(bis2,2-(allyloxymethyl)butoxide) and the like, monoalkoxides such as titanium tris (dioctyl phosphate)isopropoxide, titanium tris(dodecylbenzenesulfonate) isopropoxide and the like, titanium oxides such as titanium oxide bis(pentanedionate), titanium oxide bis(tetramethylheptanedionate), phthalocyanine oxide and the like, tetraacetylacetonates such as titanium tetraacetylacetonate and the like, titanate coupling agents such as isopropyl tridodecyl benzene sulfonyl titanate and the like, and the like.

An additive amount of these organic titanium compounds is preferably in a range of 0.3 to 25 parts by mass, and more preferably in a range of 0.5 to 5 parts by mass, relative to 100 parts by mass of polyamic acid ester (A). When the additive amount is 0.3 parts by mass or more, desired heat resistance and chemical resistance is developed, and when the amount is 25 parts by mass or less, storage stability is excellent.

Using the above-mentioned photosensitive polyamic acid ester compound, it is possible to form the cured relief pattern comprised of the photosensitive polyimide resin.

<Polyimide>

The structure of the cured relief pattern comprised of the photosensitive polyimide resin is the following formula (1).

[Chemistry 18]

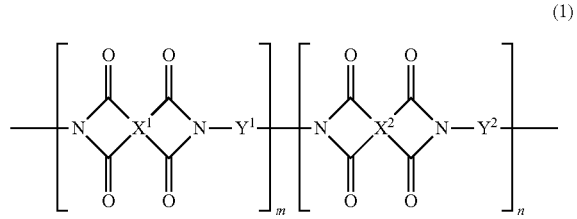

$X^1$, $X^2$, $Y^1$ and $Y^2$ in the above-mentioned formula (8) are the same $X^1$, $X^2$, $Y^1$ and $Y^2$ in the formula (1)

<Phenol Resin Composition>
(G) Phenol Resin (Photosensitive Resin)

The phenol resin is a macromolecular compound containing a phenol derivative in a repetition unit thereof. Specifically, among phenol resins are resins obtained by polymerizing an aldehyde compound, ketone compound, methylol compound, or alkoxy methyl compound with the phenol derivate; phenol-diene-based polymerization resin, polyhydroxystyrene-based resin and derivatives of the resins. Further, for example, a weight average molecular weight of the phenol resin is 1,500 or more.

Described below are the resins obtained by polymerizing an aldehyde compound, ketone compound, methylol compound, or alkoxy methyl compound with the phenol derivate.

Examples of the phenol derivatives are phenol, cresol, ethylphenol, propylphenol, butylphenol, amyl-phenol, benzylphenol, adamantane phenol, benzyloxyphenol, xylenol, catechol, resorcinol, ethyl resorcinol, hexyl resorcinol, hydroquinone, pyrogallol, fluoroglycinol, 1,2,4-trihydroxybenzene, pararosolic acid, bisphenol, bisphenol A, bisphenol AF, bisphenol B, bisphenol F, bisphenol S, dihydroxy diphenylethane, 1,1-bis(4-hydroxyphenyl)cyclohexane, 1,4-bis(3-hydroxy phenoxy benzene), 2,2-bis(4-hydroxy-3-methylphenyl)propane, α,α'-bis(4-hydroxy phenyl)1,4-diisopropyl benzene, 9,9-bis(4-hydroxy-3-methylphenyl)fluorene, 2,2-bis(3-cyclohexyl-4-hydroxyphenyl)propane, 2,2-bis(2-hydroxy-5-biphenylyl)propane, dihydroxy benzoate and the like.

Among aldehyde compounds are formaldehyde, paraformaldehyde, acetaldehyde, propionaldehyde, pivalaldehyde, butylaldehyde, pentanal, hexanal, trioxane, glyoxal, cyclohexylaldehyde, diphenylacetaldehyde, ethylbutyraldehyde, benzaldehyde, glyoxylic acid, 5-norbornene-2-carboxyaldehyde, malondialdehyde, succindialdehyde, glutaraldehyde, salicylaldehyde, naphthaldehyde, terephthalaldehyde and the like.

Among ketone compounds are acetone, methyl ethyl ketone, diethyl ketone, dipropyl ketone, dicyclohexyl ketone, dibenzyl ketone, cyclopentanone, cyclohexanone, bicyclohexanone, cyclohexanedione, 3-butyn-2-one, 2-norbornanone, adamantanone, 2,2-bis(4-oxocyclohexyl)propane and the like.

Among methylol compounds are 1,3-bis(hydroxymethyl) urea, ribitol, arabitol, allitol, 2,2-bis(hydroxymethyl)butyric acid, 2-benzyloxy-1,3-propanediol, cyclohexanedimethanol, 2,2-dimethyl-1,3-propanediol, 2,2-diethyl-1,3-propanediol, monoacetin, 2-methyl-2-nitro-1,3-propanediol, 5-norbornene-2,2-dimethanol, 5-norbornene-2,3-dimethanol, pentaerythritol, 2-phenyl-1,3-propanediol, trimethylolethane, trimethylolpropane, 3,6-bis(hydroxymethyl)durene, 2,6-bis(hydroxymethyl)-p-cresol, 2,3-bis(hydroxymethyl) naphthalene, 2,2'-bis(hydroxymethyl)diphenyl ether, 1,8-bis(hydroxymethyl)anthracene, 2,6-bis(hydroxymethyl)-1,4-dimethoxybenzene, 4,4'-biphenyl dimethanol, 1,4-benzene dimethanol, 2-nitro-p-xylene glycol, 1,3-benzene dimethanol and the like.

Among alkoxy methyl compounds are 1,4-bis(methoxymethyl)benzene, 4,4'-bis(methoxymethyl)biphenyl, 1,3,4,6-tetrakis(methoxymethyl)glycoluril, 2,4,6-tris[(bis(methoxymethyl)amino]-1,3,5-triazine and the like.

It is possible to obtain the phenol-diene-based polymerization resin by polymerizing the phenol derivative and diene-based compound.

As the phenol derivative, it is possible to use the same derivatives as the above-mentioned derivatives, and among diene-based compounds are butadiene, pentadiene, hexadiene, heptadiene, octadiene, 3-methyl-1,3-butadiene, 1,3-butanediol-dimethacrylate, 2,4-hexadiene-1-ol, methyl cyclohexadiene, cyclopentadiene, cyclohexadiene, cyclohexadiene, cyclooctadiene, dicyclopentadiene, 1-hydroxy dicyclopentadiene, 1-methyl cyclopentadiene, methyl dicyclohexadiene, diallyl ether, diallyl sulfide, diallyl adipate, 2,5-norbornadiene, tetrahydro indene, 5-ethylidene-2-norbornene, 5-vinyl-2-norbornene, triallyl cyanurate, diallyl cyanurate, triallyl isocyanurate, diallyl propyl isocyanurate and the like.

It is possible to obtain the polyhydroxystyrene-based resin by addition-polymerizing a phenol derivative having unsaturated bonds. As the phenol derivative in synthesizing the resin with the phenol derivative having unsaturated bonds addition-polymerized, there are hydroxystyrene, dihydroxystyrene, allylphenol, coumaric acid, hydroxy chalcone, N-hydroxyphenyl-5-norbornene-2,3-dicarboxylic acid imide, resveratrol, hydroxy stilbene and the like.

It is possible to make the resin by polymerizing the above-mentioned phenol derivative, while carrying out dehydration, dealcoholization, or cleavage of unsaturated bonds, and a catalyst may be used in polymerization. Among acidic catalysts are hydrochloric acid, sulfuric acid, phosphoric acid, phosphorous acid, methanesulfonic acid, p-toluenesulfonic acid, dimethyl sulfate, diethyl sulfate, acetic acid, oxalic acid, 1-hydroxyethylidene-1,1'-diphosphonic acid, zinc acetate, boron trifluoride, boron trifluoride-phenol complex, boron trifluoride-ether complex and the like. On the other hand, among alkaline catalysts are lithium hydroxide, sodium hydroxide, potassium hydrate, calcium hydroxide, barium hydrate, sodium carbonate, triethylamine, pyridine, 4-N,N-dimethylaminopyridine, piperidine, piperazine, 1,4-diazabicyclo[2,2,2]octane, 1,8-diazabicyclo[5,4,0]-7-undecene, 1,5-diazabicyclo[4,3,0]-5-nonene, ammonia, hexamethylene tetramine and the like.

The phenol resin may be a copolymer of a plurality of ingredients, and in the copolymerization, a compound may be used which does not have a phenolic hydroxyl group in a part of the phenol derivative.

The weight average molecular weight of the phenol resin preferably ranges from 1,500 to 200,000, more preferably ranges from 1,500 to 100,000, and most preferably ranges from 2,000 to 50,000.

As the phenol resin, it is possible to exemplify phenol resins having a biphenyldiyl structure in the main chain, expressed by the following formula (11). The biphenyldiyl-phenol resin is a polymer containing repletion units having the phenol structure and biphenyldiyl structure. The phenol structure and biphenyldiyl structure may be bound in any order. From the viewpoint of further elongation percentage, it is preferable that the phenol structure and biphenyldiyl structure are bound via a methylene group.

[Chemistry 19]

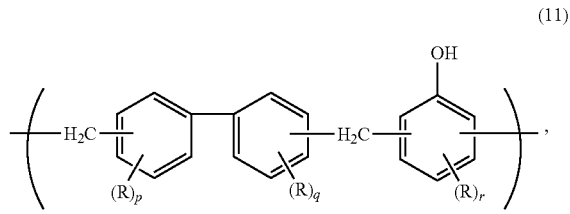
(11)

In the formula, R represents a group selected from the group consisting of a halogen atom, a carboxyl group, a hydroxyl group, aliphatic groups that may have unsaturated bonds with the carbon number of from 1 to 10, alicyclic groups with the carbon number of from 3 to 10 and aromatic groups with the carbon number of from 6 to 20, a hydrogen atom of each group may be further replaced with a halogen atom, carboxyl group or hydroxyl group. Each of p and q independently represents an integer of from 0 to 4, and r represents an integer of from 0 to 3. When p, q or r is 2 or more, each R may be the same or may be different from one another.

The number of repetition units of the repetition units of the above-mentioned formula (11) preferably ranges from 2 to 100, from the viewpoint of elongation percentage, more preferably ranges from 8 to 80, and further preferably ranges from 18 to 80.

Alternatively, as the phenol resin, for example, it is possible to exemplify phenol resins expressed by the following formula (12).

hydride groups with the carbon number of from 1 to 10, alkoxy groups with the carbon number of from 1 to 10, nitro groups, cyano groups, and groups expressed by the following formula (16) or (17), and when m2 represents 2, a plurality of $R_1$ may be the same, or may be different from one another. Each of $R_2$ to $R_5$ independently represents a hydrogen atom, a monovalent aliphatic group with the carbon number of from 1 to 10, or a monovalent aliphatic group with the carbon number of from 1 to 10 where a part or the whole of hydrogen atoms is replaced with a fluorine atom. Each of $R_6$ and $R_7$ independently represents a halogen atom, hydroxyl group, or a monovalent organic group, a plurality of $R_6$ may be the same or may be different from one another when m3 represents an integer of from 2 to 4, and a plurality of $R_7$ may be the same or may be different from one another when m4 represents an integer of from 2 to 4. Y represents a divalent organic group expressed by the following formula (14) or (15), W represents a divalent group selected from the groups consisting of a single bond, chain aliphatic groups with the carbon number of from 1 to 10, chain aliphatic groups with the carbon number of from 1 to 10 where a part or the whole of hydrogen atoms is replaced with a fluorine atom, alicyclic groups with the carbon number of from 3 to 20, alicyclic groups with the carbon number of from 3 to 20 where a part or the whole of hydrogen atoms is replaced with a fluorine atom, alkylene

[Chemistry 20]

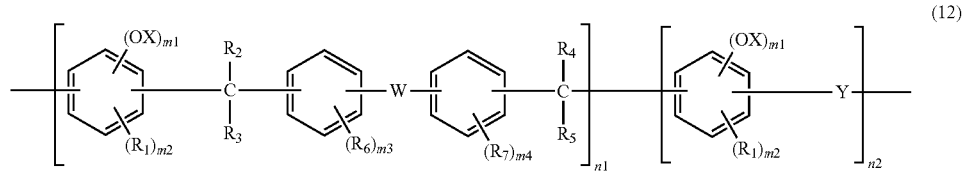
(12)

In the formula (12), each X independently represents a monovalent group selected from the group consisting of a hydrogen atom, alkoxy carbonyl groups with the carbon number of from 2 to 20, alkoxy carbonyl methyl groups with the carbon number of from 2 to 20, alkoxy alkyl groups with the carbon number of from 2 to 20, silyl groups replaced with at least one alkyl group with the carbon number of from 1 to 10, tetrahydropyranyl groups and tetrahydrofuranyl groups, each m1 independently represents an integer of from 1 to 3, each m2 independently represents an integer of from 0 to 2, where $2 \le (m1+m2) \le 4$, each of m3 and m4 independently represents an integer of from 0 to 4, and each of n1 and n2 independently represents an integer of from 1 to 500. When m1 represents 2 or 3, n1/(n1+n2) is in a rage of 0.05 to 0.95, and when m1 represents 1, n1/(n1+n2) is in a rage of 0.35 to 0.95. Each $R_1$ independently represents a monovalent group selected from the group consisting of carbon oxide groups with the number of repetition units ranging from 1 to 20, and groups expressed by the following formula (13), and the structure of the polymer may be random or may be a block.

[Chemistry 21]

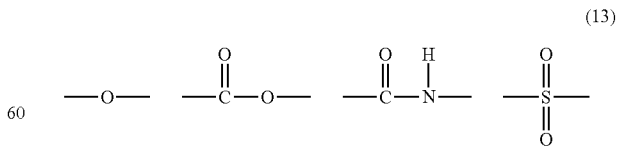

In the formula (14), each of Re and $R_9$ independently represents a group containing a hydrogen atom, a monovalent organic group with the carbon number of from 1 to 11 or a carboxyl group, a sulfonic group and a phenolic hydroxyl group.

[Chemistry 22]

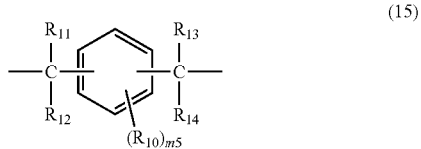

(15)

In the formula (15), each of $R_{11}$ to $R_{14}$ independently represents a hydrogen atom, a monovalent aliphatic group with the carbon number of from 1 to 10, or a monovalent aliphatic group with the carbon number of from 1 to 10 where a part or the whole of hydrogen atoms is replaced with a fluorine atom, m5 represents an integer of 1 to 4, and $R_0$ represents a hydroxyl group, a carboxyl group or a sulfonic group when m5 represents 1. Then, when m5 represents an integer of 2 to 4, at least one of $R_{10}$ represents a hydroxyl group, while the other $R_{10}$ represents a halogen atom, a hydroxyl group, a monovalent organic group, a carboxyl group, or a sulfonic group, and then all of $R_{10}$ may be the same, or may be different from one another.

[Chemistry 23]

(16)

In the formula (16), $R_{15}$ represents a monovalent group selected from the group consisting of a hydroxyl group, aliphatic groups with the carbon number of from 1 to 12, alicyclic groups with the carbon number of from 3 to 12, aromatic groups with carbon number of from 6 to 18, —$NH_2$, and groups expressed by —NH—$R_{19}$, —N($R_{19}$)$_2$ and —O—$R_{19}$ (in addition, $R_{19}$ represents a monovalent group selected from aliphatic groups with the carbon number of from 1 to 12, alicyclic groups with the carbon number of from 3 to 12, or aromatic groups with carbon number of from 6 to 18.)

[Chemistry 24]

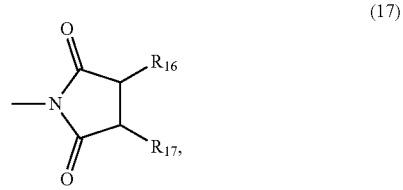

(17)

In the formula (17), each of $R_{16}$ and $R_{17'}$ independently represents a monovalent group selected from the group consisting of a hydrogen atom, aliphatic groups with the carbon number of from 1 to 12, alicyclic groups with the carbon number of from 3 to 12, and aromatic groups with carbon number of from 6 to 18, and then, $R_{16}$ and $R_{17'}$ may form a ring.

(H) Solvent

As described above, as the solvent, the composition contains the first solvent with specific gravity of 0.96 g/cm³ or more at a temperature of 25° C., and the second solvent with specific gravity of 0.77 g/cm³ or more and less than 0.96 g/cm³ at a temperature of 25° C.

In the phenol resin composition, an additive amount of the solvent ranges from 100 to 1000 parts by mass, preferably ranges from 120 to 700 parts by mass, and further preferably ranges from 150 to 500 parts by mass, relative to 100 parts by mass of the phenol resin.

(I) Crosslinking Agent

It is preferable that the phenol resin composition contains a crosslinking agent. Among crosslinking agents are epoxy compounds such as 1,1,2,2-tetra(p-hydroxyphenyl)ethane tetraglycidyl ether, glycerol triglycidyl ether, ortho-secondary butylphenyl glycidyl ether, 1,6-bis(2,3-epoxypropoxy) naphthalene, diglycerol polyglycidyl ether, poly(ethylene glycol) glycidyl ether, triglycidyl isocyanurate, EPICLON (Registered Trademark) 830, 850, 1050, N-680, N-690, N-695, N-770, HP-7200, HP-820, EXA-4850-1000 (Trade Name, made by DIC Corporation), Denacol (Registered Trademark) EX-201, EX-313, EX-314, EX-321, EX-411, EX-511, EX-512, EX-612, EX-614, EX-614B, EX-731, EX-810, EX-911, EM-150 (Trade Name, made by Nagase Chemtex Corporation) and the like, oxetane compounds such as xylylene bisoxetane, 3-ethyl-3{[(3-ethyloxetane-yl) methoxy]methyl}oxetane and the like, oxazoline compounds such as 2,2'-bis(2-oxazoline), 2,2'-isopropylidenebis (4-phenyl-2-oxazoline), 1,3-bis(4,5-dihydro-2-oxazolyl) benzene, 1,4-bis(4,5-dihydro-2-oxazolyl)benzene, EPOCROS (Registered Trademark) K-2010E, K-2020E, K-2030E, WS-500, WS-700, RPS-1005 (Trade Name, made by NIPPON SHOKUBAI CO., LTD.) and the like, carbodiimide compounds such as Carbodilite (Registered Trademark) SV-02, V-01, V-02, V-03, V-04, V-05, V-07, V-09, E-01, E-02, LA-1 (Trade Name, made by Nisshinbo Chemical Inc.) and the like, aldehyde and aldehyde modifications such as formaldehyde, glutaraldehyde, hexamethylene tetramine, trioxane, glyoxal, malondialdehyde, succindialdehyde and the like, isocyanate-based crosslinking agents such as 4,4'-diphenyl methane diisocyanate, toluilendiisocyanate, 1,3-phenylene bis(methylene) diisocyanate, dicyclohexylmethane-4,4'-diisocyanate, isophorone diisocyanate, hexamethylene diisocyanate, Takenate (Registered Trademark) 500, 600, COSMONATE NBDI, ND (Trade Name, made by Mitsui Chemicals, Inc.), DURANATE (Registered Trademark) 17B-60PX, TPA-B80E, MF-B60X, MF-K60X, E402-B80T (Trade Name, made by Asahi Kasei Chemicals Corporation) and the like, metal chelate agents such as acetylacetone aluminum (III) salt, acetylacetone titanium (IV) salt, acetylacetone chromium (III) salt, acetylacetone magnesium (II) salt, acetylacetone nickel (II) salt, trifluoro acetylacetone aluminum (III) salt, trifluoro acetylacetone titanium (IV) salt, trifluoro acetylacetone chromium (III) salt, trifluoro acetylacetone magnesium (II) salt, trifluoro acetylacetone nickel (II) salt and the like, N-methylol-based compounds such as NIKALAC (Registered Trademark) MW-30MH, MW-100LH, BL-60, MX-270, MX-280, MX-290 (Trade Name, made by Sanwa-Chemical Co., LTD.), CYMEL (Registered Trademark) 300, 303, 1123, Mycoat (Registered Trademark) 102, 105 (Trade Name, made by Nihon Cytec Company) and the like, C-methylol-based compounds such as 1,4-bis(methoxymethyl)benzene, 4,4'-bis(methoxymethyl)biphenyl and the like, unsaturated bond-containing compounds such as vinyl acetate, trimethylolpropane trimethacrylate, triallyl 1,3,5-benzenetricarboxylate, triallyl trimellitate, pyromellitic acid tetraallyl ester, pentaerythritol pentaacrylate, dipentaerythritol pentaacrylate, trimethylol propane triacrylate, ditrimethylol propane tetraacrylate, NK Ester 1G, 2G, 3G, 4G, 9G, 14G, NPG, BPE-100, BPE-200, BPE-500, BPE-1400, A-200, A-400, A-600, TMPT, A-TMM-3 (Trade Name, made by Shin-Nakamura Chemical Co., Ltd.), BANI-M, BANI-X (Trade Name, made by Maruzen Petrochemical Corporation) and the like, etc.

Among the above-mentioned crosslinking agents, from the viewpoints of elongation percentage and heat resistance of obtained heat-cured films, preferable are EPICLON (Registered Trademark) 830, 850, 1050, N-680, N-690, N-695, N-770, HP-7200, HP-820, EXA-4850-1000, Denacol (Registered Trademark) EX-201, EX-313, EX-314, EX-321, EX-411, EX-511, EX-512, EX-612, EX-614, EX-614B, EX-731, EX-810, EX-911, EM-150, xylylene bisoxetane, 3-ethyl-3{[(3-ethyloxetane-yl)methoxy]methyl}oxetane, 1,3-bis(4,5-dihydro-2-oxazolyl)benzene, NIKALAC (Registered Trademark) MW-30MH, MW-100LH, BL-60, MX-270, MX-280, MX-290, CYMEL (Registered Trademark) 300, 303, 1123, Mycoat (Registered Trademark) 102, 105, 1,4-bis(methoxymethyl)benzene, 4,4'-bis(methoxymethyl)biphenyl, vinyl acetate, trimethylolpropane trimethacrylate, triallyl 1,3,5-benzenetricarboxylate, triallyl trimellitate, pyromellitic acid tetraallyl ester, pentaerythritol pentaacrylate, dipentaerythritol pentaacrylate, trimethylol propane triacrylate, ditrimethylol propane tetraacrylate, BANI-M and BANI-X.

As a blending amount in the case of using the crosslinking agent, the amount preferably ranges from 0.1 to 30 parts by mass relative to 100 parts by mass of phenol resin.

(J) Photosensitizer

It is preferable that the phenol resin composition contains a photosensitizer. By selecting the type of the photosensitizer, it is possible to make the phenol resin composition either of the positive type and negative type. In the case of making the phenol resin composition the positive type, it is necessary to select a photoacid generator as the photosensitizer. As the photoacid generator, it is possible to use naphthoquinone diazide (NQD) compound, onium salt, halogen-containing compound and the like, and from the viewpoint of solvent solubility and storage stability, preferable are photo-active compounds having the NQD structure.

Among the onium salts are iodonium salts, sulfonium salts, phosphonium salts, ammonium salts, diazonium salts and the like, and preferable are onium salts selected from the group consisting of diaryl iodonium salts, triaryl sulfonium salts, trialkyl sulfonium salts.

As the halogen-containing compound, there are haloalkyl group-containing hydrocarbon compounds, and trichloromethyl triazine is preferable.

As the naphthoquinone diazide compound, there are compounds having 1,2-benzoquinone diazide structure, or 1,2-naphthoquinone diazide structure, and for example, these compounds are described in U.S. Pat. No. 2,772,972 Description, U.S. Pat. No. 2,797,123 Description, U.S. Pat. No. 3,669,658 Description and the like. The naphthoquinone diazide structure is at least one compound (hereinafter, also referred to as "NQD" compound) selected from the group consisting of 1,2-naphthoquinone diazide-4-sulfonic acid ester of a polyhydroxy compound having a particular structure and 1,2-naphthoquinone diazide-5-sulfonic acid ester of the polyhydroxy compound.

According to a common procedure, it is possible to obtain the NQD compound, by preparing sulfonyl chloride from a naphthoquinone diazide sulfonic acid compound using chloro sulfonic acid or thionyl chloride, and performing a condensation reaction on the obtained naphthoquinone diazide sulfonyl chloride and polyhydroxy compound. For example, it is possible to obtain the NQD compound, by reacting the polyhydroxy compound and a predetermined amount of 1,2-naphthoquinone diazide-5-sulfonyl chloride or 1,2-naphthoquinone diazide-4-sulfonyl chloride in a solvent such as dioxane, acetone and tetrahydrofuran, in the presence of a basic catalyst such as triethyl amine to esterify, washing and drying the obtained product.

As an example of preferred NQD compounds, for example, there are the following compounds.

[Chemistry 25]

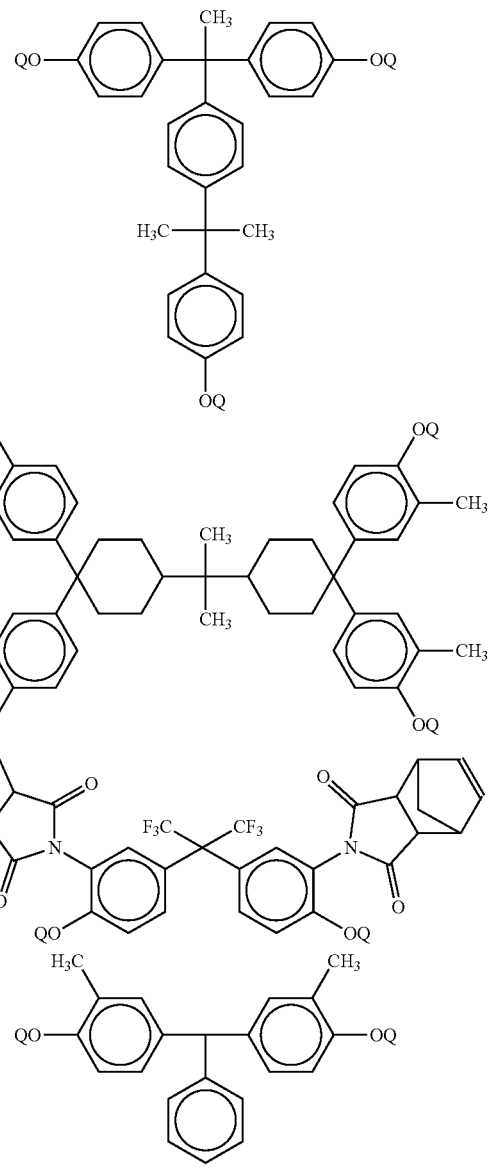

In the formula, Q represents a hydrogen atom or the following naphthoquinone diazide sulfonic acid ester group, and all Qs are not hydrogen atoms at the same time.

[Chemistry 26]

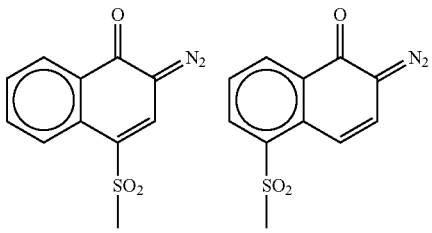

Further, it is possible to use naphthoquinone diazide sulfonyl ester compounds with a 4-naphthoquinone diazide sulfonyl group and 5-naphthoquinone diazide sulfonyl group used together in the same molecule, and it is also possible to mix a 4-naphthoquinone diazide sulfonyl ester compound and 5-naphthoquinone diazide sulfonyl ester compound to use.

A blending amount of the photosensitizer relative to 100 parts by mass of phenol resin preferably ranges from 1 to 50 parts by mass, and more preferably ranges from 5 to 30 parts by mass. When the blending amount of the photosensitizer is 1 part by mass or more, the patterning property of the resin is good, and when the blending amount is 50 parts by mass or less, the tensile elongation percentage of the cured film is good, and a development residue (scum) of the exposed portion is a few.

(K) Others

In the phenol resin, when necessary, it is possible to contain dye, surfactant, adhesive assistant to enhance adherence to the substrate, dissolution accelerator, crosslinking accelerator and the like.

As the dye, examples thereof are methyl violet, crystal violet, malachite green and the like. A blending amount of dye preferably ranges from 0.1 to 30 parts by mass relative to 100 parts by mass of phenol resin.

As the surfactant, examples thereof are glycols such as polypropylene glycol, polyoxyethylene lauryl ether and the like or nonionic surfactants comprised of derivatives thereof, fluorine-based surfactants, for example, such as FLUORAD (Registered Trademark, Trade Name, made by Sumitomo 3M Company), MEGAFACE (Registered Trademark, Trade Name, made by DIC Corporation) and LUMIFLON (Registered Trademark, Trade Name, made by Asahi Glass Co., Ltd.), and organic siloxane surfactants, for example, such as KP341 (Trade Name, made by Shin-Etsu Chemical Co., Ltd.), DBE (Trade Name, made by CHISSO CORPORATION) and GLANOL (Trade Name, made by KYOEISHA CHEMICAL Co., LTD).

As a blending amount in the case of using the surfactant, the amount preferably ranges from 0.01 to 10 parts by mass relative to 100 parts by mass of phenol resin.

As the adhesive assistant, examples thereof are alkyl imidazoline, butyric acid, alkyl acid, polyhydroxy styrene, polyvinyl methyl ether, t-butyl novolac, epoxy silane, epoxy polymer and various kinds of alkoxy silanes.

As preferable examples of the alkoxy silanes, examples thereof are tetraalkoxy silane, bis(trialkoxysilyl)methane, bis(trialkoxysilyl)ethane, bis(trialkoxysilyl)ethylene, bis(trialkoxysilyl)hexane, bis(trialkoxysilyl)octane, bis(trialkoxysilyl)octadiene, bis[3-(trialkoxysilyl)propyl]disulfide, N-phenyl-3-aminopropyltrialkoxysilane, 3-mercaptopropyltrialkoxysilane, 2-(trialkoxysilylethyl)pyridine, 3-methacryloxypropyltrialkoxysilane, 3-methacryloxypropyldialkoxyalkylsilane, vinyltrialkoxysilane, 3-ureidepropyltrialkoxysilane, 3-isocyanatepropyltrialkoxysilane, 3-(trialkoxysilyl)propyl succinic anhydride, N-(3-trialkoxysilylpropyl)-4,5-dihydroimidazole, 2-(3,4-epoxy cyclohexyl)ethyltrialkoxysilane, 3-glycidoxypropyltrialkoxyalkylsilane, 3-glycidoxypropyldialkoxyalkylsilane, 3-aminopropyltrialkoxysilane, 3-aminopropyldialkoxyalkylsilane, reactants of acid anhydride or acid dianhydride, compounds such that a urethane group or urea group substitutes for an amino group of 3-aminopropyltrialkoxysilane, or 3-aminopropyldialkoxyalkylsilane, and the like. In addition, as the alkyl group in the above-mentioned compounds, among alkyl groups are a methyl group, ethyl group, propyl group, butyl group and the like. Among acid anhydrides are maleic anhydride, phthalic anhydride, 5-norbornene-2,3-dicarboxylic anhydride and the like, among acid dianhydrides are pyromellitic dianhydride, 3,3',4,4'-benzophenonetetracarboxylic dianhydride, 4,4'-oxydiphthalic dianhydride and the like, among urethane groups are a t-butoxycarbonylamino group and the like, and among urea groups are a phenylaminocarbonyl amino group the like.

As a blending amount in the case of using the adhesive assistant, the amount preferably ranges from 0.1 to 30 parts by mass relative to 100 parts by mass of phenol resin.

As the dissolution accelerator, compounds having a hydroxyl group or carboxyl group are preferable. Examples of the compound having a hydroxyl group are a ballast agent used in the naphthoquinone diazide compound, para-cumylphenol, bisphenols, resorcinols, straight-chain phenol compounds such as MtrisPC and MtetraPC, non-straight-chain phenol compounds such as TrisP-HAP, TrisP-PHBA and TrisP-PA (all compounds are made by HONSHU CHEMICAL INDUSTRY CO., LTD.), 2 to 5 phenol substitutes of diphenyl methane, 1 to 5 phenol substitutes of 3,3-diphenylpropane, 1:2 reactant of 2,2-bis-(3-amino-4-hydroxyphenyl)hexafluoropropane and 5-norbornene-2,3-dicarboxylic anhydride, 1:2 reactant of bis-(3-amino-4-hydroxyphenyl)sulfone and 1,2-cyclhexyldicarboxylic anhydride, N-hydroxysuccinimide, N-hydroxy phthalic acid imide, N-hydroxy5-norbornene-2,3-dicarboxylic acid imide and the like.

Examples of the compound having a carboxyl group are 3-phenyllactic acid, 4-hydroxyphenyllactic acid, 4-hydroxymandelic acid, 3,4-dihydroxymandelic acid 4-hydroxy-3-methoxymandelic acid, 2-methoxy-2-(1-naphtyl)propionic acid, mandelic acid, atrolactic acid, acetyl mandelic acid, α-methoxyphenylacetic acid, 3-phenyllactic acid, 4-hydroxyphenyllactic acid, 4-hydroxymandelic acid, 3,4-dihydroxymandelic acid, 4-hydroxy-3-methoxymandelic acid, 2-methoxy-2-(1-naphtyl)propionic acid, mandelic acid, atrolactic acid, O-acetyl mandelic acid, α-methoxy phenyllactic acid, 4-hydroxymandelic acid, 3,4-dihydroxymandelic acid, 4-hydroxy-3-methoxymandelic acid, mandelic acid, atrolactic acid, O-acetyl mandelic acid, α-methoxy phenyllactic acid, O-acetyl mandelic acid, α-methoxyphenylacetic acid and the like.

As a blending amount in using the dissolution accelerator, the amount preferably ranges from 0.1 to 30 parts by mass relative to 100 parts by mass of phenol resin.

As the crosslinking accelerator, preferable are compounds which generate an acid, base and/or radical by heat or light. Among compounds which generate acids by heat or light are onium salts such as TPS-105, 1000, DTS-105, NDS-105, 165 (Trade Name, made by Midori Kagaku Co., LTD.), DPI-DMAS, TTBPS-TF, TPS-TF, DTBPI-TF (Trade Name, made by Toyo Gosei Co., Ltd.) and the like, sulfonates such as methyl methanesulfonate, ethyl methanesulfonate, methyl benzenesulfonate, methyl p-toluenesulfonate, methoxyethyl p-toluenesulfonate and the like, oxime sulfonates such as NAI-100, 101, 105, 106, PAI-101 (Trade Name, made by Midori Kagaku Co., LTD.), IRGACURE (Registered Trademark) PAG-103, 108, 121, 203, CGI-1380, 725, NIT, 1907, PNBT (Trade Name, made by BASF Japan) and the like. Among compounds which generate bases by heat or light are amine salts such as U-CATSA-1, 102, 506, 603, 810 (Trade Name, made by San-Apro Ltd.), CGI-1237, 1290, 1293 (Trade Name, made by BASF Japan) and the like, compounds such that a urethane group or urea group substitutes for an amino group of 2,6-piperidine or butylamine, diethylamine, dibutylamine, N—N'-diethyl-1,6-diaminohexane, hexamethylene diamine, etc. and the like. Among urethane groups are a t-butoxycarbonylamino group and the like, and among urea groups are a phenylaminocarbonyl amino group the like. Among compounds which generate radicals by heat or light are alkyl phenons such as IRGACURE 651, 184, 2959, 127, 907, 369, 379 (Trade Name, made by BASF Japan) and the like, acylphosphine oxides such as IRGACURE 819 (Trade Name, made by BASF Japan) and the like, titanocenes such as IRGACURE 784(Trade Name, made by BASF Japan) and the like, oxime esters such as IRGACURE OXE01, 02 (Trade Name, made by BASF Japan) and the like, etc.

<Poly(Benzoxazole) Resin Compound>

For example, it is possible to use poly(benzoxazole) precursors described in Japanese Unexamined Patent Publication No. 2015-141352 as the photosensitive resin.

As the solvent, the composition contains the first solvent with specific gravity of 0.96 g/cm$^3$ or more at a temperature of 25° C., and the second solvent with specific gravity of 0.77 g/cm$^3$ or more and less than 0.96 g/cm$^3$ at a temperature of 25° C.

Further, it is possible to contain photosensitizers, cross-linking agents, photoacid generators and the like described in Japanese Unexamined Patent Publication No. 2015-141352.

EXAMPLES

Examples performed to clarify the effects of the present invention will be described below. In the Examples, the following materials and measurement methods were used.
(Ingredient A-1; Synthesis of Polyimide Precursor)

In a 2 L-separable flask was placed 155.1 g of 4,4'-oxydiphthalic dianhydride (ODPA). Further, 131.2 g of 2-hydroxyethyl methacrylate (HEMA) and 400 ml of γ-butyrolactone were placed, the mixture was stirred at room temperature, 81.5 g of pyridine was added, while stirring, and a reaction mixture was obtained. After the finish of heating by the reaction, the mixture was cooled to room temperature, and was left to stand for 16 hours.

Next, under ice-cooling, 206.3 g of dicyclohexyl carbodiimide (DCC) was dissolved in 180 ml of γ-butyrolactone, and the obtained solution was added to the reaction mixture for 40 minutes, while stirring. Then, a suspension with 93.0 g of 4,4'-diaminodiphenyl ether (DADPE) and 350 ml of γ-butyrolactone was added for 60 minutes, while stirring. Further, after stirring at room temperature for 2 hours, 30 ml of ethyl alcohol was added, the mixture was stirred for 1 hour, and next, 400 ml of γ-butyrolactone was added. Precipitates generated in the reaction mixture were removed by filtration to obtain a reaction liquid.

The obtained reaction liquid is added to 3 l of ethyl alcohol to generate a precipitate comprised of crude polymer. The generated rough polymer was filtered, and was dissolved in 1.5 l of tetrahydrofuran to obtain a crude polymer solution. The obtained crude polymer solution was dropped into 28 l of water to precipitate the polymer, and after filtering the obtained precipitate, the resultant was dried in a vacuum to obtain the powder-shaped polymer (polyimide precursor (ingredient A-1)). A molecular weight of the polyimide precursor (ingredient A-1) was measured by Gel Permeation Chromatography (in terms of standard polystyrene), and the weight average molecular weight (Mw) was 20000. The measurement method of the weight average molecular weight will be described later.
(Ingredient A-2; Synthesis of Polyimide Precursor)

The reaction was carried out by the same method as described in the synthesis method 1, except that 147.1 g of 3,3',4,4'-biphenyltetracarboxylic dianhydride was used as a substitute for 155.1 g of 4,4'-oxydiphthalic dianhydride, and a polyimide precursor (ingredient A-2) was obtained. A molecular weight of the polyimide precursor (ingredient A-2) was measured by Gel Permeation Chromatography (in terms of standard polystyrene), and the weight average molecular weight (Mw) was 22,000.
(Ingredient A-3; Synthesis of Phenol Resin)

First, nitrogen was substituted in a 1.0 L-separable flask with a Dean-Stark apparatus, and subsequently, in the separable flask, 91.8 g (0.833 mol) of resorcin, 109.0 g (0.45 mol) of 4,4'-bis(methoxymethyl)biphenyl (BMMB), 3.81 g (0.02 mol) of p-toluenesulfonic acid, and 116 g of propylene glycol monomethyl ether (PGME) were mixed and stirred at 50° C. to dissolve the solid.

The dissolved mixed solution was heated to 120° C. with an oil bath, and it was confirmed that methanol was generated from the reaction liquid. The reaction liquid was stirred at 120° C. for 3 hours, without any processing.

Next, separately, in a container, 8.3 g (0.050 mol) of 2,6-bis(hydroxymethyl)-p-cresol and 83 g of PGME were mixed and stirred, the uniformly dissolved solution was dropped into the separable flask for 1 hour, using a dropping funnel, and after dropping, the resultant was further stirred for 2 hours.

After the finish of the reaction, the reaction container was cooled in the atmosphere, 50 g of PGME was separately added to the container, and the resultant was stirred. The aforementioned reaction diluent was dropped into 8 L of water under high-speed stirring to disperse and precipitate the resin, the resin was collected, washed as appropriate, dehydrated, and then, was subjected to vacuum drying, and the phenol resin (ingredient A-3) was obtained with an yield of 78%. The weight average molecular weight of thus synthesized phenol resin (ingredient A-3) by GPC was 6,600 in terms of polystyrene.
(Ingredient A-4; Synthesis of Poly(Benzoxazole) Precursor)

In a 3 L-separable flask, 183.1 g (0.5 mol) of 2,2-bis(3-amino-4-hydroxyphenyl)hexafluoropropane, 640.9 g of N,N-dimethylacetamide (DMAc) and 63.3 g (0.8 mol) of pyridine were mixed and stirred at room temperature (25° C.) to be a uniform solution. Into the solution was dropped a liquid obtained by dissolving 118.0 g (0.4 mol) of 4,4'-diphenyl ether dicarbonyl chloride in 354 g of diethylene glycol dimethyl ether (DMDG) with a dropping funnel. At this point, the separable flask was cooled in a water bath at 15° C. to 20° C. The time taken for dropping was 40 minutes, and the reaction liquid temperature was 30° C. at the maximum.

Three hours later after the finish of dropping, 30.8 g (0.2 mol) of 1,2-cyclohexyl dicarboxylic anhydride was added to the reaction liquid, the resultant was stirred and left at room temperature for 15 hours, and 99% of all amine terminal groups of the polymer chain were blocked with carboxycyclohexyl amide groups. It is possible to readily calculate the reaction rate at this point, by tracking a residual amount of charged 1,2-cyclohexyl dicarboxylic anhydride by High Performance Liquid Chromatography (HPLC). Subsequently, the reaction liquid was dropped into 2 L of water under high speed stirring to disperse and precipitate a polymer, the polymer was collected, washed as appropriate, dehydrated, and then, was subjected to vacuum drying, and a poly(benzoxazole) precursor (ingredient A-4) was obtained with the weight average molecular weight measured by Gel Permeation Chromatography of 9000 (in terms of standard polystyrene). The obtained polymer as described above was re-dissolved in γ-butyrolactone, and was then treated with cation exchange resin and anion exchange resin, thus obtained solution was charged into ion exchange water, and subsequently, by filtering the precipitated polymer, washing, and performing vacuum drying, the purified polymer was obtained.

(Measurement of Weight Average Molecular Weight)

The weight average molecular weight (Mw) of each of the above-mentioned ingredients was measured by Gel Permeation Chromatography (in terms of standard polystyrene). The column used in measurement was Shodex (Registered Trademark) 805M/806M serial (Trade Name) made by SHOWA DENKO K.K., and as standard monodisperse polystyrene, chosen was Shodex STANDARD SM-105 (Trade Name) made by SHOWA DENKO K.K. The development solvent was N-methyl-2-pyrrolidone, and Shodex RI-930 (Trade Name) made by SHOWA DENKO K.K. was used for the detector.

(In regard to ingredients B, C, D and E)

(1) Ingredient B (Solvent)

Ingredient B-1 γ-butyrolactone (Hereinafter, referred to as GBL)

Ingredient B-2 N-methyl-2-pyrrolidone (Hereinafter, referred to as NMP)

Ingredient B-3 Acetone

Ingredient B-4 2-butanone (Ethyl Methyl Ketone or MEK)

Ingredient B-5 Cyclohexanone

Ingredient B-6 2-oxtanone

Ingredient B-7 Cyclopentanone

Ingredient B-8 3,5,5-trimethylcyclohexanone

Ingredient B-9 2-nonanone

Ingredient B-10 propylene glycol monomethyl ether acetate (Hereinafter, referred to as PGMEA)

(2) Ingredient C (Crosslinking Agent)

Ingredient C-1 NIKALAC (Registered Trademark) MX-270 (Trade Name, made by Sanwa-Chemical Co., LTD.) In addition, the chemical formula of the ingredient C-1 is as described below.

[Chemistry 27]

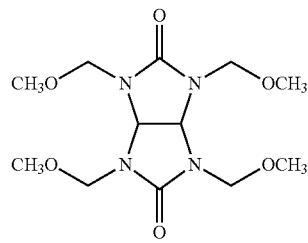

Ingredient C-2 triglycidyl isocyanurate

In addition, the chemical formula of the ingredient C-2 is as described below.

[Chemistry 28]

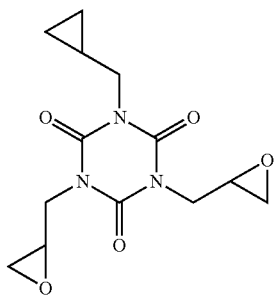

Ingredient C-3 ETERNACOLL OXBP (Trade Name, made by UBE INDUSTRIES, LTD.

In addition, the chemical formula of the ingredient C-3 is as described below.

[Chemistry 29]

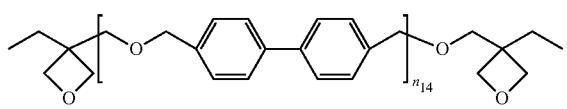

Ingredient C-4 DURANATE (Registered Trademark) TPA-B80E (Trade Name, made by Asahi Kasei Chemicals Corporation)

In addition, the chemical formula of the ingredient C-4 is as described below.

[Chemistry 30]

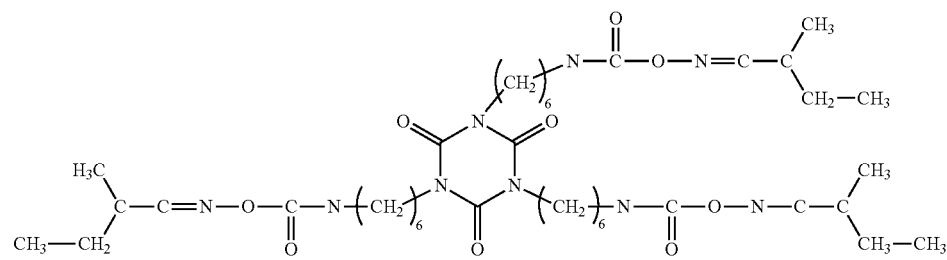

(3) Ingredient D (Photoacid Generator)

Ingredient D-1 Photoacid generator expressed by the following formula

[Chemistry 31]

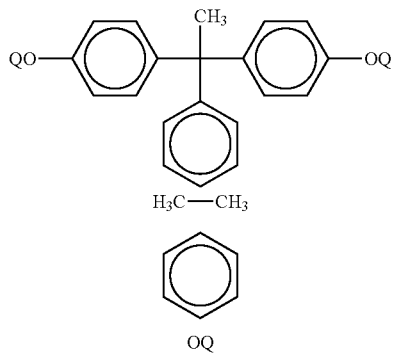

In the formula, among Qs, 83% is structure expressed by the following formula, and residuals are hydrogen atoms.

[Chemistry 32]

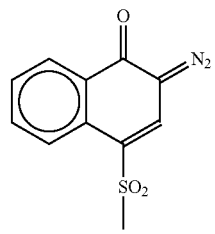

(4) Ingredient E (Initiator)

Ingredient E-1 1-phenyl-1,2-propanedione-2-(O-ethoxycarbonyl)-oxime

Example 1

A photosensitive resin composition was prepared using the polyimide precursor (ingredient A-1) by the following method, and the prepared composition was evaluated. In a mixed solvent comprised of 95 g of GBL (ingredient B-1) and 5 g of acetone (ingredient B-3) was dissolved 100 g of the polyimide precursor A-1 that is polyamic acid ester, together with 10 g of 1-phenyl-1,2-propanedione-2-(O-ethoxycarbonyl)-oxime (photoinitiator, ingredient E-1), 2 g of 1,3,5-tris(4-t-butyl-3-hydroxy-2,6-dimethylbenzyl-1,3,5-triazine-2,4,6-(1H,3H,5H)-trione (phenol compound), 8 g of N-phenyldiethanolamine, 0.05 g of 7-diethylamino-3-ethoxycarbonylcoumalin, 5 g of hexamethoxy methyl melamine, 8 g of tetraethylene glycol dimethacrylate, 1.5 g of N-[3-(triethoxysilyl)propyl]phthalamic acid, and 0.05 g of 2-nitroso-1-naphthol, and the resultant was filtered with a filter of 0.1 μm to be a negative type photosensitive resin composition.

The composition was applied and dried onto a silicon wafer and copper substrate according to the method as described previously, and subsequently, was subjected to exposure and development. Then, the resultant was subjected to heat curing processing at 190° C. The time of the heat curing processing was adjusted so that the first solvent amount was 9 ppm in the cured film after heat curing. In thus obtained polyimide coating film, when the film thickness after coating and drying was 11 μm, the thickness was 9 μm, and the film thickness after curing was 7 μm. Evaluations were made on the composition and tensile elongation percentage, adhesion test and the presence or absence of cracks after relief pattern formation of the coating film obtained according to the methods as described previously. In addition, the evaluation methods will be described later.

Example 2

A photosensitive resin composition was prepared as in Example 1, except that a mixed solvent comprised of 70 g of GBL and 30 g of acetone was substituted for the mixed solvent comprised of 95 g of GBL and 5 g of acetone, and that the time of the heat curing processing was adjusted so that the first solvent amount was 10 ppm in the cured film after heat curing, and each evaluation was made.

Example 3

A photosensitive resin composition was prepared as in Example 1, except that a mixed solvent comprised of 50 g of GBL and 50 g of acetone was substituted for the mixed solvent comprised of 95 g of GBL and 5 g of acetone, and that the time of the heat curing processing was adjusted so that the first solvent amount was 21 ppm in the cured film after heat curing, and each evaluation was made.

Example 4

A photosensitive resin composition was prepared as in Example 1, except that a mixed solvent comprised of 50 g of NMP (ingredient B-2) and 50 g of acetone was substituted for the mixed solvent comprised 50 g of GBL and 50 g of acetone, and that the time of the heat curing processing was adjusted so that the first solvent amount was 12 ppm in the cured film after heat curing, and each evaluation was made.

Example 5

In 50 g of GBL and 50 g of acetone were dissolved 100 g of the phenol resin (ingredient A-3), 10 g of the cross-linking agent (ingredient C-1) and 11 g of the photoacid generator (ingredient D-1), the resultant was filtered with a filter of 0.1 μm to prepare a positive type photosensitive resin composition, the time of the heat curing processing was adjusted so that the first solvent amount was 10 ppm in the cured film after heat curing, and each evaluation was made.

Example 6

A photosensitive resin composition was prepared as in Example 1, except that a mixed solvent comprised of 95 g of GBL and 5 g of methyl ethyl ketone (hereinafter, referred to as MEK; ingredient B-4) was substituted for the mixed solvent comprised of 95 g of GBL and 5 g of acetone, and that the time of the heat curing processing was adjusted so that the first solvent amount was 5 ppm in the cured film after heat curing, and each evaluation was made.

Example 7

In 95 g of GBL and 5 g of methyl ethyl ketone were dissolved 100 g of the poly(benzoxazole) precursor (ingredient A-4) and 11 g of the photoacid generator (ingredient D-1), the resultant was filtered with a filter of 0.1 μm to prepare a positive type photosensitive resin composition, the time of the heat curing processing was adjusted so that the first solvent amount was 6 ppm in the cured film after heat curing, and each evaluation was made.

Example 8

A photosensitive resin composition was prepared as in Example 7, except that the phenol resin (ingredient A-3) was substituted for the poly(benzoxazole) precursor (ingredient A-4), 10 g of the crosslinking agent (ingredient C-1) was further dissolved, and that the time of the heat curing processing was adjusted so that the first solvent amount was 10 ppm in the cured film after heat curing, and each evaluation was made.

Example 9

A photosensitive resin composition was prepared as in Example 1, except that a mixed solvent comprised of 80 g of GBL and 20 g of methyl ethyl ketone was substituted for the mixed solvent comprised of 95 g of GBL and 5 g of acetone, 10 g of the crosslinking agent (ingredient C-2) was substituted for 10 g of the crosslinking agent (ingredient C-1), and that the time of the heat curing processing was adjusted so that the first solvent amount was 15 ppm in the cured film after heat curing, and each evaluation was made.

Example 10

A photosensitive resin composition was prepared as in Example 1, except that the polyimide precursor (ingredient A-2) was substituted for the polyimide precursor (ingredient A-1), a mixed solvent comprised of 40 g of GBL and 60 g of methyl ethyl ketone was substituted for the mixed solvent comprised of 95 g of GBL, 5 g of acetone and 1 g of the photoinitiator (ingredient E-1), 10 g of the crosslinking agent (ingredient C-2) was substituted for 10 g of the crosslinking agent (ingredient C-1), and that the time of the heat curing processing was adjusted so that the first solvent amount was 7 ppm in the cured film after heat curing, and each evaluation was made.

Example 11

A photosensitive resin composition was prepared as in Example 1, except that a mixed solvent comprised of 95 g of GBL and 5 g of cyclohexanone was substituted for the mixed solvent comprised of 95 g of GBL and 5 g of acetone, 10 g of the crosslinking agent (ingredient C-2) was substituted for 10 g of the crosslinking agent (ingredient C-1), the curing temperature was changed to 180° C., and that the time of the heat curing processing was adjusted so that the first solvent amount was 9 ppm in the cured film after heat curing, and each evaluation was made.

Example 12

A photosensitive resin composition was prepared as in Example 11, except that a mixed solvent comprised of 50 g of GBL and 50 g of cyclohexanone was substituted for the mixed solvent comprised of 95 g of GBL and 5 g of acetone, 10 g of the crosslinking agent (ingredient C-3) was substituted for 10 g of the crosslinking agent (ingredient C-2), the curing temperature was changed to 190° C., and that the time of the heat curing processing was adjusted so that the first solvent amount was 18 ppm in the cured film after heat curing, and each evaluation was made.

Example 13

A photosensitive resin composition was prepared as in Example 11, except that a mixed solvent comprised of 95 g of GBL and 5 g of 2-nonanone (ingredient B-9) was substituted for the mixed solvent comprised of 95 g of GBL and 5 g of acetone, 10 g of the crosslinking agent (ingredient C-3) was substituted for 10 g of the crosslinking agent (ingredient C-2), and that the time of the heat curing processing was adjusted so that the first solvent amount was 19 ppm in the cured film after heat curing, and each evaluation was made.

Example 14

A photosensitive resin composition was prepared as in Example 13, except that a mixed solvent comprised of 97 g of GBL and 3 g of 2-octanone was substituted for the mixed solvent comprised of 95 g of GBL and 5 g of 2-nonanone, and that the time of the heat curing processing was adjusted so that the first solvent amount was 21 ppm in the cured film after heat curing, and each evaluation was made.

Example 15

A photosensitive resin composition was prepared as in Example 1, except that the poly(benzoxazole) precursor (ingredient A-4) was substituted for the polyimide precursor (ingredient A-1), a mixed solvent comprised of 70 g of GBL and 30 g of 2-octanone was substituted for the mixed solvent comprised of 95 g of GBL and 5 g of acetone, 10 g of the photoacid generator (ingredient D-1) was substituted for 10 g of the crosslinking agent (ingredient C-1) and 10 g of the photoinitiator (ingredient E-1), and that the time of the heat curing processing was adjusted so that the first solvent amount was 12 ppm in the cured film after heat curing, and each evaluation was made.

Example 16

A photosensitive resin composition was prepared as in Example 1, except that the phenol resin (ingredient A-3) was substituted for the polyimide precursor (ingredient A-1), a mixed solvent comprised of 50 g of GBL and 50 g of 2-octanone was substituted for the mixed solvent comprised of 95 g of GBL and 5 g of acetone, 10 g of the crosslinking agent (ingredient C-2) was substituted for 10 g of the crosslinking agent (ingredient C-1), 10 g of the photoacid generator (ingredient D-1) was substituted for 1 g of the photoinitiator (ingredient E-1), the curing temperature was changed to 180° C., and that the time of the heat curing processing was adjusted so that the first solvent amount was 12 ppm in the cured film after heat curing, and each evaluation was made.

Example 17

A photosensitive resin composition was prepared as in Example 1, except that a mixed solvent comprised of 97 g of GBL and 3 g of cyclopentanone was substituted for the mixed solvent comprised of 95 g of GBL and 5 g of acetone, 10 g of the crosslinking agent (ingredient C-3) was substituted for 10 g of the crosslinking agent (ingredient C-1), and that the time of the heat curing processing was adjusted so that the first solvent amount was 15 ppm in the cured film after heat curing, and each evaluation was made.

Example 18

A photosensitive resin composition was prepared as in Example 7, except that a mixed solvent comprised of 70 g of GBL and 30 g of cyclopentanone was substituted for the mixed solvent comprised of 95 g of GBL and 5 g of methyl ethyl ketone, 10 g of the crosslinking agent (ingredient C-4) and 10 g of the photoacid generator (ingredient D-1) were substituted for 10 g of the photoacid generator (ingredient D-1), and that the time of the heat curing processing was adjusted so that the first solvent amount was 12 ppm in the cured film after heat curing, and each evaluation was made.

Example 19

A photosensitive resin composition was prepared as in Example 5, except that a mixed solvent comprised of 50 g of GBL and 50 g of cyclopentanone was substituted for the mixed solvent comprised of 50 g of GBL and 50 g of acetone, 10 g of the crosslinking agent (ingredient C-4) and 10 g of the photoacid generator (ingredient D-1) were substituted for 10 g of the crosslinking agent (ingredient C-1), and that the time of the heat curing processing was adjusted so that the first solvent amount was 15 ppm in the cured film after heat curing, and each evaluation was made.

Example 20

A photosensitive resin composition was prepared as in Example 1, except that a mixed solvent comprised of 97 g of GBL and 3 g of 3,5,5-trimethylcyclohexanone was substituted for the mixed solvent comprised of 95 g of GBL and 5 g of acetone, 10 g of the crosslinking agent (ingredient C-3) was substituted for 10 g of the crosslinking agent (ingredient C-1), and that the time of the heat curing processing was adjusted so that the first solvent amount was 30 ppm in the cured film after heat curing, and each evaluation was made.

Example 21

A photosensitive resin composition was prepared as in Example 7, except that a mixed solvent comprised of 70 g of GBL and 30 g of 3,5,5-trimethylcyclohexanone was substituted for the mixed solvent comprised of 95 g of GBL and 5 g of acetone, and that the time of the heat curing processing was adjusted so that the first solvent amount was 67 ppm in the cured film after heat curing, and each evaluation was made.

Example 22

A photosensitive resin composition was prepared as in Example 5, except that a mixed solvent comprised of 50 g of GBL and 50 g of 3,5,5-trimethylcyclohexanone was substituted for the mixed solvent comprised of 50 g of GBL and 50 g of acetone, 10 g of the crosslinking agent (ingredient C-4) was substituted for 10 g of the crosslinking agent (ingredient C-1), and that the time of the heat curing processing was adjusted so that the first solvent amount was 41 ppm in the cured film after heat curing, and each evaluation was made.

Example 23

A photosensitive resin composition was prepared as in Example 1, except that a mixed solvent comprised of 30 g of 2-octanone and 70 g of PGMEA was substituted for the mixed solvent comprised of 95 g of GBL and 5 g of acetone, 10 g of the photoacid generator (ingredient D-1) was substituted for 10 g of the crosslinking agent (ingredient C-1) and 10 g of the photoinitiator (ingredient E-1), and that the time of the heat curing processing was adjusted so that the first solvent amount was 8 ppm in the cured film after heat curing, and each evaluation was made.

Example 24

A photosensitive resin composition was prepared as in Example 20, except that a mixed solvent comprised of 70 g of NMP and 30 g of 3,5,5-trimethylcyclohexanone was substituted for the mixed solvent comprised of 97 g of GBL and 3 g of 3,5,5-trimethylcyclohexanone, and that the time of the heat curing processing was adjusted so that the first solvent amount was 90 ppm in the cured film after heat curing, and each evaluation was made.

Example 25

A photosensitive resin composition was prepared as in Example 20, except that a mixed solvent comprised of 95 g of NMP and 5 g of 3,5,5-trimethylcyclohexanone was substituted for the mixed solvent comprised of 97 g of GBL and 3 g of 3,5,5-trimethylcyclohexanone, the curing temperature was changed to 180° C., and that the time was adjusted so that the first solvent amount was 143 ppm in the cured film after heat curing, and each evaluation was made.

Example 26

A photosensitive resin composition was prepared as in Example 25, except that a mixed solvent comprised of 80 g of NMP and 20 g of 3,5,5-trimethylcyclohexanone was substituted for the mixed solvent comprised of 95 g of NMP and 5 g of 3,5,5-trimethylcyclohexanone, and that the time was adjusted so that the first solvent amount was 188 ppm in the cured film after heat curing, and each evaluation was made.

Example 27

A photosensitive resin composition was prepared as in Example 26, except that a mixed solvent comprised of 90 g of NMP and 10 g of 3,5,5-trimethylcyclohexanone was substituted for the mixed solvent comprised of 80 g of NMP and 20 g of 3,5,5-trimethylcyclohexanone, the heat curing temperature was changed to 170° C., and that the time was adjusted so that the first solvent amount was 291 ppm in the cured film after heat curing, and each evaluation was made.

Example 28

A photosensitive resin composition was prepared as in Example 27, except that the heat curing temperature was changed to 160° C., and that the time was adjusted so that the first solvent amount was 493 ppm in the cured film after heat curing, and each evaluation was made.

Example 29

A photosensitive resin composition was prepared as in Example 28, except that a mixed solvent comprised of 65 g of NMP and 35 g of 2-octanone was substituted for the mixed solvent comprised of 90 g of NMP and 10 g of 3,5,5-trimethylcyclohexanone, and that the time was adjusted so that the first solvent amount was 795 ppm in the cured film after heat curing, and each evaluation was made.

Example 30

A photosensitive resin composition was prepared as in Example 29, except that the heat curing temperature was changed to 150° C., and that the time was adjusted so that the first solvent was 1020 ppm in the cured film after heat curing, and each evaluation was made.

Example 31

A photosensitive resin composition was prepared as in Example 24, except that the heat curing temperature was changed to 145° C., and that the time was adjusted so that the first solvent amount was 2100 ppm in the cured film after heat curing, and each evaluation was made.

Comparative Example 1

Comparative Example 1 was performed as in Example 1, except that the solvent was replaced with GBL alone in Example 1, and that the time of the heat curing processing was adjusted so that the first solvent amount was 3 ppm in the cured film after heat curing.

Comparative Example 2

Comparative Example 2 was performed as in Example 1, except that the solvent was replaced with NMP alone in Example 1, and that the time of the heat curing processing was adjusted so that the first solvent amount was 4 ppm in the cured film after heat curing.

Comparative Example 3

Comparative Example 3 was performed as in Example 1, except that the solvent was replaced with a mixed solvent of GBL and NMP in Example 1, and that the time of the heat curing processing was adjusted so that the first solvent amount was 4 ppm in the cured film after heat curing.

Comparative Example 4

Comparative Example 4 was performed as in Example 1, except that the solvent was replaced with a mixed solvent of GBL and ethyl lactate in Example 1, and that the time of the heat curing processing was adjusted so that the first solvent amount was 3 ppm in the cured film after heat curing.

Comparative Example 5

Comparative Example 5 was performed as in Example 1, except that the solvent was replaced with a mixed solvent of NMP and ethyl lactate in Example 1, and that the time of the heat curing processing was adjusted so that the first solvent amount was 3 ppm in the cured film after heat curing.

Comparative Example 6

Comparative Example 6 was performed as in Example 1, except that the solvent was replaced with a mixed solvent of GBL and dimethyl sulfoxide (DMSO) in Example 1, and that the time of the heat curing processing was adjusted so that the first solvent amount was 3 ppm in the cured film after heat curing.

Comparative Example 7

A photosensitive resin composition was prepared as in Example 21, except that the solvent was replaced with NMP alone in Example 21, and that the time of the heat curing processing was adjusted so that the first solvent amount was 3 ppm in the cured film after heat curing, and each evaluation was made.

Comparative Example 8

A photosensitive resin composition was prepared as in Example 8, except that the solvent was replaced with GBL alone in Example 8, the crosslinking agent (ingredient C-2) was substituted for the crosslinking agent (ingredient C-1), and that the time of the heat curing processing was adjusted so that the first solvent amount was 3 ppm in the cured film after heat curing, and each evaluation was made.

<Tensile Elongation Percentage Measurement>

Samples for elongation percentage measurement were prepared by the following method. In other words, each of photosensitive resin compositions obtained in the Examples and Comparative Examples was rotation-applied to a 6-inch silicon wafer substrate provided with an aluminum deposition layer provided on the uppermost surface, so that the film thickness after curing was about 10 µm, and pre-bake was performed on a hot plate at 120° C. for 180 seconds to form a coating film.

The film thickness was measured with a film thickness measurement apparatus (Lambda Ace) made by Screen Holdings Co., Ltd. The coating film was heated at 180° C. for 1 hour in an atmosphere of nitrogen, and the film with the film thickness of 10 µm was obtained.

The obtained resin cured film was cut into samples with a width of 3 mm using a dicing saw, the film was then removed from the wafer with a diluted hydrochloric acid aqueous solution, and after leaving obtained 20 samples in an atmosphere at a temperature of 23° C. and 50% relative humidity for 24 hours or more, the elongation percentage was measured with a tensile testing machine (Tensilon). Measurement conditions of the tensile testing machine were as described below.

Temperature: 23° C.
Relative humidity: 50%
Initial sample length: 50 mm
Test velocity: 40 mm/min
Load cell rating: 2 kgf <Adhesion Test>

The adhesion with the epoxy resin of the coating film comprised of each photosensitive resin composition was measured as described below. In other words, a pin with a diameter of 2 mm was bonded to the coating film on the silicon wafer subjected to the heat processing, using an epoxy resin adhesive (made by SHOWA KOBUNSHI K.K., Araldite Standard). The sample was subjected to the adhesion test, using a tensile testing machine (made by Quad Group Inc., Sebastian V).

Evaluation: Adhesion strength 70 kg/mm$^2$ or more . . . Adhesion force Good
60-50 kg/mm$^2$ . . . Available
Less than 50 kg/mm$^2$ . . . Poor (Crack Test)

First, the prepared photosensitive resin composition was applied to a silicon wafer. Application of the photosensitive resin composition was performed by rotation coating using a spinner. Next, pre-bake was performed at 130° C. to dry the coating film of the photosensitive resin composition, and subsequently, the photosensitive resin composition was exposed. As the exposure apparatus, NSR i-11 made by Nikon TEC Corporation was used, and exposure was performed in 400 mJ/cm$^2$.

Next, development was performed by a paddle method in the case of the positive type, while being performed by a rotation spray method in the case of the negative type. From the applied photosensitive resin composition by development, it is possible to obtain a relief pattern by eluting and removing an exposed portion (the case of the positive type) or an unexposed portion (the case of the negative pattern). As the developing solution, tetramethylammonium hydroxide (2.38% in water) was used in the case of the positive type, and cyclopentanone was used in the case of the negative type.

After development, washing was performed with a rinsing solution, the developing solution was removed, and a pattern film was thereby obtained. As the rinsing solution, distilled water was used in the case of the positive type, and propylene glycol dimethyl ether acetate was used in the case of the negative type.

Next, by heating thus obtained relief pattern, the cured relief pattern was obtained. The heating temperatures were temperatures as described in Tables 1 and 2.

Finally, thus obtained cured relief pattern was further processed for 1000 hours on the heating condition of 150° C., and a pattern formation portion with line/space of 10 μm/10 μm and the interface with the silicon wafer were observed with a scanning electron microscope (SEM) Then, ranking was performed as described below.
The absence of crack and the absence of peeling: ○
The presence of crack or the presence of peeling: X As a further severe reliability test, the obtained cured relief pattern was processed for 2000 hours on the heating condition of 150° C., and the pattern formation portion with line/space of 10 μm/10 μm and the interface with the silicon wafer were observed with the scanning electron microscope (SEM). Then, ranking was performed as described below.
The absence of crack and the absence of peeling: ⊚
The presence of crack and the absence of peeling: ○
The absence of crack and the presence of peeling: Δ
The presence of crack and the presence of peeling: X <Measurement Method a of the First Solvent in the Cured Film (Gas Chromatography-Mass Spectrometry Using Cyclopentanone)>

In cyclopentanone was dissolved 0.02 g of the obtained cured film sample. Next, the solution was weighed in a plurality of headspace vials. Next, an NMP standard solution with a known concentration was added stepwise. Then, Gas Chromatography-Mass Spectrometry (GCMS) was measured on a gas phase portion generated in heating on the conditions of 200° C.×60 minm.

In addition, the measurement conditions of GCMS were as described below.
Apparatus: Made by Agilent Technologies Company 6890 GC/5973N MSD
Column: Made by Agilent J&W Company DB-5 ms (Length 30 m, Inside diameter 0.25 mm, Film thickness 1 μm)
Carrier gas: Helium
Temperature rise condition: 40° C. (5 min)-10° C./min rise of temperature—280° C. (0 min)
Measurement time: 29 minutes
First solvent standard addition concentration: 0 μg, 0.1 μg, 0.5 μg, 1 μg
Measurement method: Selective ion detection method
Quantitative method: A calibration curve was generated from an area value of the first solvent detected by chromatography of quantitative ion and an additive amount of the first solvent, and a value obtained by dividing the intercept by the gradient was made a quantitative value.

<Measurement Method B of the First Solvent in the Cured Film (Gas Chromatography-Mass Spectrometry Using a Pyrolyzer)>

Weighed was 0.01 g of obtained cured film sample, the sample was heated on the condition of 200° C.×15 min. using a pyrolyzer (made by Frontier Laboratories Ltd. EGA/PY-303D), and generated gas was collected at the column end with liquid nitrogen. Subsequently, the collected gas was returned to a predetermined temperature, and was measured by GCMS. Further, the first solvent was dissolved in cyclopentanone in a plurality of concentrations, and was similarly measured by GCMS.

In addition, the measurement conditions of GCMS were as described below.
Apparatus: Made by Agilent Technologies Company 7890B GC/5977A MSD
Column: Made by Agilent J&W Company DB-1 (Length 30 m, Inside diameter 0.32 mm, Film thickness 5 μm)
Carrier gas: Helium
Temperature rise condition: 50° C. (5 min)-10° C./min rise of temperature—300° C. (0 min)
Measurement time: 30 minutes
First solvent solution concentration for calibration generation: 500 ppm, 100 ppm, 10 ppm
Measurement method: Selective ion detection method
Quantitative method: A calibration curve was generated from an area value of the first solvent detected from the first solvent solution for calibration generation, and a quantitative value was calculated from the area value of the first solvent detected by chromatography of quantitative ion.

The following Tables 1 and 2 show ingredients of each Example and each Comparative Example, and results of each evaluation.

TABLE 1

|  | Example 1 | Example 2 | Example 3 | Example 4 | Example 3 | Example 6 | Example 7 | Example 8 |
| --- | --- | --- | --- | --- | --- | --- | --- | --- |
| Ingredient A-1 | PI① | PI① | PI① | PI① | — | PI① | — | — |
| Ingredient A-2 | — | — | — | — | — | — | — | — |
| Ingredient A-3 | — | — | — | — | Phenol① | — | — | Phenol① |
| Ingredient A-4 | — | — | — | — | — | — | PBO① | — |
| Ingredient B-1 | GBL(95) | GBL(70) | GBL(50) | — | GBL(50) | GBL(95) | GBL(95) | GBL(95) |
| Ingredient B-2 | — | — | — | NMP(50) | — | — | — | — |
| Ingredient B-3 | Acetone(5) | Acetone(30) | Acetone(50) | Acetone(50) | Acetone(50) | — | — | — |
| Ingredient B-4 | — | — | — | — | — | MEK(5) | MEK(5) | MEK(5) |
| Ingredient B-5 | — | — | — | — | — | — | — | — |

TABLE 1-continued

| | | | | | | | | |
|---|---|---|---|---|---|---|---|---|
| Ingredient B-6 | — | — | — | — | — | — | — | — |
| Ingredient B-7 | — | — | — | — | — | — | — | — |
| Ingredient B-8 | — | — | — | — | — | — | — | — |
| Ingredient B-9 | — | — | — | — | — | — | — | — |
| Ingredient B-10 | — | — | — | — | — | — | — | — |
| Other, Ingredient B | — | — | — | — | — | — | — | — |
| Ingredient C-1 | 10 | 10 | 10 | 10 | 10 | 10 | — | 10 |
| Ingredient C-2 | — | — | — | — | — | — | — | — |
| Ingredient C-3 | — | — | — | — | — | — | — | — |
| Ingredient C-4 | — | — | — | — | — | — | — | — |
| Ingredient D-1 | — | — | — | — | 10 | — | 10 | 10 |
| Ingredient E-1 | 1 | 1 | 1 | 1 | — | 1 | — | — |
| Curing temperature | 190 | 190 | 190 | 190 | 190 | 190 | 190 | 190 |
| First solvent amount [ppm] contained in cured film by measurement method A [ppm] | 9 | 10 | 21 | 12 | 10 | 5 | 6 | 10 |
| First solvent amount [ppm] contained in cured film by measurement method B [ppm] | 11 | 13 | 25 | 16 | 12 | 5 | 7 | 13 |
| Elongation percentage [%] | 50 | 53 | 45 | 45 | 43 | 61 | 61 | 61 |
| Adhesion [kg/mm] | >70 | >70 | >70 | >70 | >70 | >70 | >70 | >70 |
| Pattern crack of reliability (150° C., 1000 hours) | ◯ | ◯ | ◯ | ◯ | ◯ | ◯ | ◯ | ◯ |
| Pattern crack of reliability (150° C., 2000 hours) | ◯ | ◯ | ◯ | ◯ | ◯ | ◯ | ◯ | ◯ |

| | Example 9 | Example 10 | Example 11 | Example 12 | Example 13 | Example 14 | Example 15 |
|---|---|---|---|---|---|---|---|
| Ingredient A-1 | PI① | — | PI① | PI① | PI① | PI① | — |
| Ingredient A-2 | — | PI② | — | — | — | — | — |
| Ingredient A-3 | — | — | — | — | — | — | — |
| Ingredient A-4 | — | — | — | — | — | — | PBO① |
| Ingredient B-1 | GBL(80) | GBL(40) | GBL(95) | GBL(50) | GBL(95) | GBL(97) | GBL(70) |
| Ingredient B-2 | — | — | — | — | — | — | — |
| Ingredient B-3 | — | — | — | — | — | — | — |
| Ingredient B-4 | MEK(20) | MEK(60) | — | — | — | — | — |
| Ingredient B-5 | — | — | Cyclohex-anone (5) | Cyclohex-anone (50) | — | — | — |
| Ingredient B-6 | — | — | — | — | — | 2-octanone (3) | 2-octanone (30) |
| Ingredient B-7 | — | — | — | — | — | — | — |
| Ingredient B-8 | — | — | — | — | — | — | — |
| Ingredient B-9 | — | — | — | — | 2-nonanoe(5) | — | — |
| Ingredient B-10 | — | — | — | — | — | — | — |
| Other, Ingredient B | — | — | — | — | — | — | — |
| Ingredient C-1 | — | — | — | — | — | — | — |
| Ingredient C-2 | 10 | 10 | 10 | — | — | — | — |
| Ingredient C-3 | — | — | — | 10 | 10 | 10 | — |
| Ingredient C-4 | — | — | — | — | — | — | — |
| Ingredient D-1 | — | — | — | — | — | — | 10 |
| Ingredient E-1 | 1 | — | 1 | 1 | 1 | 1 | — |
| Curing temperature | 190 | 190 | 180 | 190 | 190 | 190 | 190 |
| First solvent amount [ppm] contained in cured film by measurement method A [ppm] | 15 | 7 | 9 | 18 | 19 | 21 | 12 |
| First solvent amount [ppm] contained in cured film by measurement method B [ppm] | 18 | 7 | 10 | 21 | 23 | 24 | 15 |
| Elongation percentage [%] | 48 | 44 | 51 | 51 | 57 | 61 | 63 |
| Adhesion [kg/mm] | >70 | >70 | >70 | >70 | >70 | >70 | >70 |
| Pattern crack of reliability (150° C., 1000 hours) | ◯ | ◯ | ◯ | ◯ | ◯ | ◯ | ◯ |
| Pattern crack of reliability (150° C., 2000 hours) | ◯ | ◯ | ◯ | ◯ | ◯ | ◯ | ◯ |

| | Example 16 | Example 17 | Example 18 | Example 19 |
|---|---|---|---|---|
| Ingredient A-1 | — | PI① | — | — |
| Ingredient A-2 | — | — | — | — |
| Ingredient A-3 | Phenol① | — | — | Phenol① |
| Ingredient A-4 | — | — | PBO① | — |
| Ingredient B-1 | GBL(50) | GBL(97) | GBL(70) | GBL(50) |
| Ingredient B-2 | — | — | — | — |
| Ingredient B-3 | — | — | — | — |

TABLE 1-continued

|  |  |  |  |  |
|---|---|---|---|---|
| Ingredient B-4 | — | — | — | — |
| Ingredient B-5 | — | — | — | — |
| Ingredient B-6 | 2-octanone (50) | — | — | — |
| Ingredient B-7 | — | Cyclopentanone(3) | Cyclopentanone(30) | Cyclopentanone(50) |
| Ingredient B-8 | — | — | — | — |
| Ingredient B-9 | — | — | — | — |
| Ingredient B-10 | — | — | — | — |
| Other, Ingredient B | — | — | — | — |
| Ingredient C-1 | — | — | — | — |
| Ingredient C-2 | — | — | — | — |
| Ingredient C-3 | 10 | 10 | — | — |
| Ingredient C-4 | — | — | 10 | 10 |
| Ingredient D-1 | 10 | — | 10 | 10 |
| Ingredient E-1 | — | 1 | — | — |
| Curing temperature | 180 | 190 | 190 | 190 |
| First solvent amount [ppm] contained in cured film by measurement method A [ppm] | 12 | 15 | 12 | 15 |
| First solvent amount [ppm] contained in cured film by measurement method B [ppm] | 16 | 17 | 15 | 17 |
| Elongation percentage [%] | 62 | 52 | 55 | 52 |
| Adhesion [kg/mm] | >70 | >70 | >70 | >70 |
| Pattern crack of reliability (150° C., 1000 hours) | ○ | ○ | ○ | ○ |
| Pattern crack of reliability (150° C., 2000 hours) | ○ | ○ | ○ | ○ |

TABLE 2

|  | Example 20 | Example 21 | Example 22 | Example 23 | Example 24 | Example 25 |
|---|---|---|---|---|---|---|
| Ingredient A-1 | PI① | — | — | PI① | PI① | PI① |
| Ingredient A-2 | — | — | — | — | — | — |
| Ingredient A-3 | — | — | Phenol① | — | — | — |
| Ingredient A-4 | — | PBO① | — | — | — | — |
| Ingredient B-1 | GBL(97) | GBL(70) | GBL(50) | — | — | — |
| Ingredient B-2 | — | — | — | — | NMP(70) | NMP(95) |
| Ingredient B-3 | — | — | — | — | — | — |
| Ingredient B-4 | — | — | — | — | — | — |
| Ingredient B-5 | — | — | — | — | — | — |
| Ingredient B-6 | — | — | — | 2-octanone (30) | — | — |
| Ingredient B-7 | — | — | — | — | — | — |
| Ingredient B-8 | 3,5,5-trimethyl-cyclohexanone(3) | 3,5,5-trimethyl-cyclohexanone(30) | 3,5,5-trimethyl-cyclohexanone(50) | — | 3,5,5-trimethyl-cyclohexanone(30) | 3,5,5-trimethyl-cyclohexanone(5) |
| Ingredient B-9 | — | — | — | — | — | — |
| Ingredient B-10 | — | — | — | PGMEA(70) | — | — |
| Other, Ingredient B | — | — | — | — | — | — |
| Ingredient C-1 | — | — | — | — | — | — |
| Ingredient C-2 | — | — | — | — | — | — |
| Ingredient C-3 | 10 | — | — | — | 10 | 10 |
| Ingredient C-4 | — | — | 10 | — | — | — |
| Ingredient D-1 | — | 10 | 10 | 10 | — | — |
| Ingredient E-1 | 1 | — | — | — | 1 | 1 |
| Curing temperature | 190 | 190 | 190 | 190 | 190 | 180 |
| First solvent amount [ppm] contained in cured film by measurement method A [ppm] | 30 | 67 | 41 | 8 | 90 | 143 |
| First solvent amount [ppm] contained in cured film by measurement method B [ppm] | 35 | 72 | 45 | 10 | 96 | 148 |
| Elongation percentage [%] | 52 | 55 | 52 | 50 | 54 | 52 |
| Adhesion [kg/mm] | >70 | >70 | >70 | 68 | >70 | >70 |
| Pattern crack of reliability (150° C., 1000 hours) | ○ | ○ | ○ | ○ | ○ | ○ |
| Pattern crack of reliability (150° C., 2000 hours) | ○ | ◎ | ○ | ○ | ◎ | ◎ |

TABLE 2-continued

| | Example 26 | Example 27 | Example 28 | Example 29 | Example 30 | Example 31 | Comparative Example 1 |
|---|---|---|---|---|---|---|---|
| Ingredient A-1 | PI① | PI① | PI① | PI① | PI① | PI① | PI① |
| Ingredient A-2 | — | — | — | — | — | — | — |
| Ingredient A-3 | — | — | — | — | — | — | — |
| Ingredient A-4 | — | — | — | — | — | — | — |
| Ingredient B-1 | — | — | — | — | — | — | GBL(100) |
| Ingredient B-2 | NMP(80) | NMP(90) | NMP(90) | NMP(65) | NMP(75) | NMP(70) | |
| Ingredient B-3 | — | — | — | — | — | — | |
| Ingredient B-4 | — | — | — | — | — | — | |
| Ingredient B-5 | — | — | — | — | — | — | |
| Ingredient B-6 | — | — | — | 2-octanone (35) | 2-octanone (25) | — | |
| Ingredient B-7 | — | — | — | — | — | — | |
| Ingredient B-8 | 3,5,5-trimethyl-cyclohexanone (20) | 3,5,5-trimethyl-cyclohexanone (10) | 3,5,5-trimethyl-cyclohexanone (10) | — | — | 3,5,5-trimethyl-cyclohexanone (30) | |
| Ingredient B-9 | — | — | — | — | — | — | |
| Ingredient B-10 | — | — | — | — | — | — | |
| Other, Ingredient B | | | | | | | |
| Ingredient C-1 | — | — | — | — | — | — | 10 |
| Ingredient C-2 | — | — | — | — | — | — | — |
| Ingredient C-3 | 10 | 10 | 10 | 10 | 10 | 10 | — |
| Ingredient C-4 | — | — | — | — | — | — | — |
| Ingredient D-1 | — | — | — | — | — | — | — |
| Ingredient E-1 | 1 | — | 1 | 1 | 1 | 1 | 1 |
| Curing temperature | 180 | 170 | 160 | 160 | 150 | 145 | 190 |
| First solvent amount [ppm] contained in cured film by measurement method A [ppm] | 188 | 291 | 493 | 795 | 1020 | 2100 | 3 |
| First solvent amount [ppm] contained in cured film by measurement method B [ppm] | 195 | 298 | 500 | 810 | 1035 | 2130 | 4 |
| Elongation percentage [%] | 52 | 50 | 49 | 41 | 33 | 28 | 12 |
| Adhesion [kg/mm] | >70 | >70 | >70 | >70 | 69 | 65 | 44 |
| Pattern crack of reliability (150° C., 1000 hours) | ○ | ○ | ○ | ○ | ○ | ○ | X |
| Pattern crack of reliability (150° C., 2000 hours) | ◎ | ◎ | ◎ | ○ | Δ | Δ | X |

| | Comparative Example 2 | Comparative Example 3 | Comparative Example 4 | Comparative Example 5 | Comparative Example 6 | Comparative Example 7 | Comparative Example 8 |
|---|---|---|---|---|---|---|---|
| Ingredient A-1 | PI① | PI① | PI① | PI① | PI① | — | — |
| Ingredient A-2 | — | — | | | | — | — |
| Ingredient A-3 | — | — | | | | — | Phenol① |
| Ingredient A-4 | — | — | | | | PBO① | — |
| Ingredient B-1 | — | GBL(50) | GBL(70) | — | GBL(70) | — | GBL(100) |
| Ingredient B-2 | NMP(100) | NMP(50) | — | NMP(80) | — | NMP(100) | — |
| Ingredient B-3 | | | — | | — | | — |
| Ingredient B-4 | | | — | | — | | — |
| Ingredient B-5 | | | — | | — | | — |
| Ingredient B-6 | | | — | | — | | — |
| Ingredient B-7 | | | — | | — | | — |
| Ingredient B-8 | | | — | | — | | — |
| Ingredient B-9 | | | — | | — | | — |
| Ingredient B-10 | | | — | | — | | — |
| Other, Ingredient B | | | Ethyl lactate(30) | Ethyl lactate(20) | DSMO(30) | — | — |
| Ingredient C-1 | 10 | 10 | 10 | 10 | 10 | — | — |
| Ingredient C-2 | — | — | — | — | — | — | 10 |
| Ingredient C-3 | — | — | — | — | — | — | — |
| Ingredient C-4 | — | — | — | — | — | — | — |
| Ingredient D-1 | — | — | — | — | — | 10 | 10 |
| Ingredient E-1 | 1 | 1 | 1 | 1 | 1 | — | — |
| Curing temperature | 190 | 190 | 190 | 190 | 190 | 190 | 190 |
| First solvent amount [ppm] contained in cured film by measurement method A [ppm] | 4 | 4 | 3 | 3 | 3 | 3 | 3 |
| First solvent amount [ppm] contained in cured film by measurement method B [ppm] | 4 | 4 | 3 | 4 | 3 | 4 | 3 |
| Elongation percentage [%] | 8 | 12 | 7 | 9 | 10 | 11 | 6 |
| Adhesion [kg/mm] | 38 | 51 | 44 | 41 | 43 | 15 | 30 |

TABLE 2-continued

| | | | | | | | |
|---|---|---|---|---|---|---|---|
| Pattern crack of reliability (150° C., 1000 hours) | X | X | X | X | X | X | X |
| Pattern crack of reliability (150° C., 2000 hours) | X | X | X | X | X | X | X |

As shown in Table 2, in any of Comparative Examples, it was not possible to obtain sufficient elongation percentage. Further, peeling occurred in the adhesion test results, and the evaluation was "poor".

In contrast thereto, in the Examples, it was possible to obtain higher elongation percentage than in the Comparative Examples. Further, peeling did not occur in the adhesion test results, and the evaluation was "good".

Moreover, also in the pattern crack, in contrast to that cracks appeared in the Comparative Examples, any crack did not occur in the Examples, and it was possible to obtain high reliability.

Particularly, In Example 21 and Examples 24 to 28 where the second solvent with specific gravity of 0.77 g/cm³ or more and less than 0.96 g/cm³ at a temperature of 25° C. was 70 ppm or more, also on the severe reliability test conditions, neither crack nor peeling occurred, and it was possible to maintain the good pattern shape.

Further, in Examples 14 to 16 that contained 2-octanone as the second solvent with specific gravity of 0.77 g/cm³ or more and less than 0.96 g/cm³ at a temperature of 25° C., it was understood that higher elongation percentage is obtained.

When the Fan-Out type semiconductor devices containing the epoxy resin in the mold resin were prepared using the photosensitive resin compositions described in Examples 1 to 31, the devices operated without any problems.

INDUSTRIAL APPLICABILITY

The present invention is suitably applied to a semiconductor device having a semiconductor element and a redistribution layer connected to the semiconductor element, and particularly, to the Fan-Out type semiconductor device.

The invention claimed is:

1. A semiconductor device comprising:
a semiconductor element; and
a redistribution layer electrically connected to the semiconductor element and comprising an interlayer insulation film,
wherein the interlayer insulation film comprises a solvent with specific gravity of 0.96 g/cm³ or more at a temperature of 25° C. in an amount of 5 ppm or more relative to the entire weight of an interlayer insulation film, as measured in a gas chromatography-mass spectrometry test using cyclopentanone or a gas chromatography-mass spectrometry test using a pyrolyzer.

2. The semiconductor device according to claim 1, wherein the solvent with specific gravity of 0.96 g/cm³ or more at a temperature of 25° C. is present in an amount of 30 percent by weight or less inside the interlayer insulation film.

3. The semiconductor device according to claim 1, wherein in a planar view, the redistribution layer is larger than the semiconductor element.

4. The semiconductor device according to claim 3, further containing:

a sealing material to seal the semiconductor element, wherein the sealing material contacts the interlayer insulation film.

5. The semiconductor device according to claim 4, wherein the sealing material contains an epoxy resin.

6. The semiconductor device according to claim 1, wherein the interlayer insulation film contains a polyimide skeleton.

7. The semiconductor device according to claim 6, wherein the interlayer insulation film contains a polyimide expressed by the following formula 1

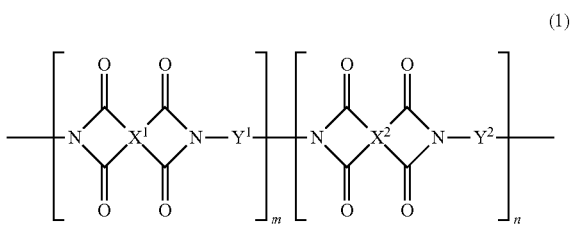

(1)

in which each of $X^1$ and $X^2$ represents a teteravalent organic group, and each of $Y^1$ and $Y^2$ represents a divalent organic group; $X^1$ and $X^2$ may be the same or may be different from each other, and $Y^1$ and $Y^2$ may be the same or may be different from each other; and m and n are integers.

8. The semiconductor device according to claim 7, wherein at least one of $X^1$ and $X^2$ in the formula (1) contains at least one structure selected from the following formulas (2) to (4)

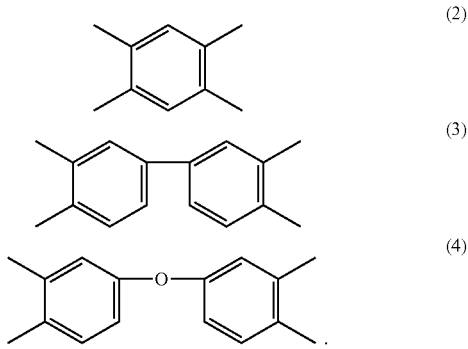

(2)

(3)

(4)

9. The semiconductor device according to claim 8, wherein at least one of $X^1$ and $X^2$ in the formula (1) contains the structure of the formula (4).

10. The semiconductor device according to claim 7, wherein at least one of $Y^1$ and $Y^2$ in the formula (1) contains at least one structure selected from the following formulas (5) to (7);

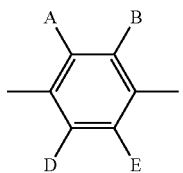

(5)

in which A, B, D, and E represent hydrogen atoms or monovalent aliphatic groups with the carbon number of from 1 to 4, and may be the same or may be different from one another;

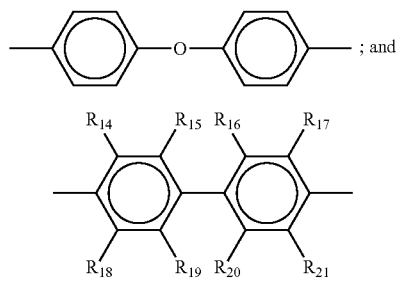

(6) ; and (7)

in which each of $R_{14}$ to $R_{21}$ represents a hydrogen atom, a halogen atom or a monovalent organic group with the carbon number of from 1 to 4, and may be different from one another, or may be the same.

11. The semiconductor device according to claim 10, wherein at least one of $Y^1$ and $Y^2$ in the formula (1) contains the structure of the formula (6).

12. The semiconductor device according to claim 8, wherein the interlayer insulation film contains a first polyimide expressed by the formula (1) and a second polyimide expressed by the formula (1), at least one of $X^1$ and $X^2$ of the first polyimide contains the structure of the formula (3), and at least one of $X^1$ and $X^2$ of the second polyimide contains the structure of the formula (4).

13. The semiconductor device according to claim 10, wherein the interlayer insulation film contains a first polyimide expressed by the formula (1) and a second polyimide expressed by the formula (1), at least one of $X^1$ and $X^2$ of the first polyimide contains the structure of the formula (3), at least one of $X^1$ and $X^2$ of the second polyimide contains the structure of the formula (4), at least one of $Y^1$ and $Y^2$ of the first polyimide contains the structure of the formula (6), and at least one of $Y^1$ and $Y^2$ of the second polyimide contains the structure of the formula (6).

14. The semiconductor device according to claim 1, wherein the interlayer insulation film contains a poly(benzoxazole) skeleton.

15. The semiconductor device according to claim 1, wherein the interlayer insulation film contains a phenol skeleton.

16. The semiconductor device according to claim 1, wherein the solvent contains at least one solvent selected from γ-butyrolactone, N-methyl-2-pyrrolidone, ethyl lactate, dimethyl sulfoxide, and propylene glycol monomethyl ether acetate (PGMEA).

17. The semiconductor device according to claim 1, wherein the solvent with specific gravity of 0.96 g/cm³ or more at a temperature of 25° C. is present in an amount of 10 ppm to 2000 ppm relative to the entire weight of the interlayer insulation film.

18. The semiconductor device according to claim 17, wherein the solvent with specific gravity of 0.96 g/cm³ or more at a temperature of 25° C. is present in an amount of 20 ppm to 500 ppm relative to the entire weight of the interlayer insulation film.

19. The semiconductor device according to claim 17, wherein the solvent with specific gravity of 0.96 g/cm³ or more at a temperature of 25° C. is present in an amount of 20 ppm to 400 ppm relative to the entire weight of the interlayer insulation film.

20. The semiconductor device according to claim 17, wherein the solvent with specific gravity of 0.96 g/cm³ or more at a temperature of 25° C. is present in an amount of 40 ppm to 300 ppm relative to the entire weight of the interlayer insulation film.

21. The semiconductor device according to claim 1, wherein the solvent with specific gravity of 0.96 g/cm³ or more at a temperature of 25° C. is present in an amount of 50 ppm or more relative to the entire weight of the interlayer insulation film.

22. The semiconductor device according to claim 21, wherein the solvent with specific gravity of 0.96 g/cm³ or more at a temperature of 25° C. is present in an amount of 100 ppm or more relative to the entire weight of the interlayer insulation film.

23. The semiconductor device according to claim 22, wherein the solvent with specific gravity of 0.96 g/cm³ or more at a temperature of 25° C. is present in an amount of 150 ppm or more relative to the entire weight of the interlayer insulation film.

24. The semiconductor device according to claim 23, wherein the solvent with specific gravity of 0.96 g/cm³ or more at a temperature of 25° C. is present in an amount of 200 ppm or more relative to the entire weight of the interlayer insulation film.

25. The semiconductor device according to claim 24, wherein the solvent with specific gravity of 0.96 g/cm³ or more at a temperature of 25° C. is present in an amount of 250 ppm or more relative to the entire weight of the interlayer insulation film.

26. The semiconductor device according to claim 25, wherein the solvent with specific gravity of 0.96 g/cm³ or more at a temperature of 25° C. is present in an amount of 300 ppm or more relative to the entire weight of the interlayer insulation film.

27. A method of manufacturing a semiconductor device, including:
a preparation step of preparing a semiconductor element; and
a redistribution layer formation step of forming a redistribution layer connected to the semiconductor element,
wherein the redistribution layer formation step includes a relief pattern formation step of exposing and developing a photosensitive resin composition to form a relief pattern, and
an interlayer insulation film formation step of heating the relief pattern to form an interlayer insulation film inside the redistribution layer,
the photosensitive resin composition contains a photosensitive resin, a first solvent with specific gravity of 0.96 g/cm³ or more at a temperature of 25° C., and a second solvent with specific gravity of 0.77 g/cm³ or more and less than 0.96 g/cm³ at a temperature of 25° C., and in the interlayer insulation film formation step, the relief pattern is heated so that the solvent with specific gravity of 0.96 g/cm³ or more at a temperature of 25° C. remains in an amount of 5 ppm or more inside the interlayer insulation film, in a gas chromatography-mass spectrometry test using cyclopentanone or a gas chromatography-mass spectrometry test using a pyrolyzer.

28. The method of manufacturing a semiconductor device according to claim 27, wherein in a planar view, the redistribution layer is larger than the semiconductor element.

29. The method of manufacturing a semiconductor device according to claim 27, further including:
a sealing step of sealing the semiconductor element with a sealing material containing an epoxy resin.

30. The method of manufacturing a semiconductor device according to claim 27, wherein in the interlayer insulation film formation step, the relief pattern is heated at a temperature of 190° C. or less.

31. The method of manufacturing a semiconductor device according to claim 27, wherein [weight of the first solvent]/[weight of the second solvent] contained in the photosensitive resin composition ranges from 0.01 to 100.

32. The method of manufacturing a semiconductor device according to claim 27, wherein the second solvent contains a ketone-based solvent.

33. The method of manufacturing a semiconductor device according to claim 32, wherein the second solvent contains 2-octanone.

34. The method of manufacturing a semiconductor device according to claim 27, wherein the first solvent contains at least one solvent selected from γ-butyrolactone, N-methyl-2-pyrrolidone, ethyl lactate, dimethyl sulfoxide, and propylene glycol monomethyl ether acetate (PGMEA).

35. The method of manufacturing a semiconductor device according to claim 27, wherein the photosensitive resin contains at least one resin selected from a polyimide precursor, a poly(benzoxazole) precursor, and a phenol resin.

36. The method of manufacturing a semiconductor device according to claim 27, wherein in the interlayer insulation film formation step, the relief pattern is heated so that the solvent with specific gravity of 0.96 g/cm³ or more at a temperature of 25° C. remains in an amount of 50 ppm or more inside the interlayer insulation film, in the gas chromatography-mass spectrometry test using cyclopentanone or the gas chromatography-mass spectrometry test using a pyrolyzer.

37. The method of manufacturing a semiconductor device according to claim 36, wherein in the interlayer insulation film formation step, the relief pattern is heated so that the solvent with specific gravity of 0.96 g/cm³ or more at a temperature of 25° C. remains in an amount of 100 ppm or more inside the interlayer insulation film, in the gas chromatography-mass spectrometry test using cyclopentanone or the gas chromatography-mass spectrometry test using a pyrolyzer.

38. The method of manufacturing a semiconductor device according to claim 36, wherein in the interlayer insulation film formation step, the relief pattern is heated so that the solvent with specific gravity of 0.96 g/cm³ or more at a temperature of 25° C. remains in an amount of 150 ppm or more inside the interlayer insulation film, in the gas chromatography-mass spectrometry test using cyclopentanone or the gas chromatography-mass spectrometry test using a pyrolyzer.

39. The method of manufacturing a semiconductor device according to claim 36, wherein in the interlayer insulation film formation step, the relief pattern is heated so that the solvent with specific gravity of 0.96 g/cm³ or more at a temperature of 25° C. remains in an amount of 200 ppm or more inside the interlayer insulation film, in the gas chromatography-mass spectrometry test using cyclopentanone or the gas chromatography-mass spectrometry test using a pyrolyzer.

40. The method of manufacturing a semiconductor device according to claim 36, wherein in the interlayer insulation film formation step, the relief pattern is heated so that the solvent with specific gravity of 0.96 g/cm³ or more at a temperature of 25° C. remains in an amount of 250 ppm or more inside the interlayer insulation film, in the gas chromatography-mass spectrometry test using cyclopentanone or the gas chromatography-mass spectrometry test using a pyrolyzer.

41. The method of manufacturing a semiconductor device according to claim 36, wherein in the interlayer insulation film formation step, the relief pattern is heated so that the solvent with specific gravity of 0.96 g/cm³ or more at a temperature of 25° C. remains in an amount of 300 ppm or more inside the interlayer insulation film, in the gas chromatography-mass spectrometry test using cyclopentanone or the gas chromatography-mass spectrometry test using a pyrolyzer.

* * * * *